United States Patent
Adachi et al.

(10) Patent No.: US 11,158,704 B2
(45) Date of Patent: Oct. 26, 2021

(54) SEMICONDUCTOR DEVICE AND POWER CONVERSION DEVICE

(71) Applicant: Mitsubishi Electric Corporation, Chiyoda-ku (JP)

(72) Inventors: Kohei Adachi, Tokyo (JP); Katsutoshi Sugawara, Tokyo (JP); Yutaka Fukui, Tokyo (JP); Rina Tanaka, Tokyo (JP); Kazuya Konishi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 491 days.

(21) Appl. No.: 16/090,784

(22) PCT Filed: Jan. 18, 2017

(86) PCT No.: PCT/JP2017/001444
§ 371 (c)(1),
(2) Date: Oct. 2, 2018

(87) PCT Pub. No.: WO2017/187670
PCT Pub. Date: Nov. 2, 2017

(65) Prior Publication Data
US 2019/0206987 A1    Jul. 4, 2019

(30) Foreign Application Priority Data

Apr. 27, 2016 (JP) .............................. JP2016-088733

(51) Int. Cl.
*H01L 29/06* (2006.01)
*H01L 29/78* (2006.01)
(Continued)

(52) U.S. Cl.
CPC ...... *H01L 29/0623* (2013.01); *H01L 29/1095* (2013.01); *H01L 29/12* (2013.01);
(Continued)

(58) Field of Classification Search
CPC . H01L 29/06; H01L 29/0603; H01L 29/0623; H01L 29/107; H01L 29/1095;
(Continued)

(56) References Cited

U.S. PATENT DOCUMENTS 6,184,556 B1 * 2/2001 Yamazaki ........... H01L 27/1203
257/219
2005/0161732 A1    7/2005 Mizukami et al.
(Continued)

FOREIGN PATENT DOCUMENTS

JP    2005-236267 A    9/2005
JP    2009-094203 A    4/2009
(Continued)

OTHER PUBLICATIONS

International Search Report dated Mar. 28, 2017 in PCT/JP2017/001444 filed Jan. 18, 2017.

*Primary Examiner* — Matthew V Nguyen
(74) *Attorney, Agent, or Firm* — Xsensus LLP

(57) ABSTRACT

A semiconductor device including: a trench gate; a trench-bottom protecting layer of a second conductivity type provided in a semiconductor layer of a first conductivity type while contacting a bottom of trenches; and a depletion suppressing layer of the first conductivity type provided between adjacent trench-bottom protecting layers, wherein the depletion suppressing layer includes an intermediate point that is horizontally equidistant to the adjacent trench-bottom protecting layers and is formed of a size to contact neither the trenches nor the trench-bottom protecting layers, and an impurity concentration of the depletion suppressing layer is set higher than an impurity concentration of the semiconductor layer.

19 Claims, 18 Drawing Sheets

(51) Int. Cl.
 *H01L 29/12* (2006.01)
 *H01L 29/10* (2006.01)
 *H02M 1/08* (2006.01)
 *H02M 7/5387* (2007.01)
 *H02P 27/08* (2006.01)

(52) U.S. Cl.
 CPC .......... *H01L 29/78* (2013.01); *H01L 29/7813* (2013.01); *H02M 1/08* (2013.01); *H02M 7/53871* (2013.01); *H02P 27/08* (2013.01)

(58) Field of Classification Search
 CPC ..... H01L 29/12; H01L 29/78; H01L 29/7813; H02M 1/08; H02M 7/53; H02M 7/53871; H02P 27/08
 See application file for complete search history.

(56) References Cited

U.S. PATENT DOCUMENTS

| | | |
|---|---|---|
| 2009/0090920 A1 | 4/2009 | Endo et al. |
| 2016/0211334 A1 | 7/2016 | Tanaka et al. |
| 2018/0248008 A1* | 8/2018 | Sugawara ........... H01L 29/7813 |
| 2020/0279940 A1* | 9/2020 | Kono .................. H01L 29/7806 |

FOREIGN PATENT DOCUMENTS

| | | | | |
|---|---|---|---|---|
| JP | WO-2016047438 A1 | * | 3/2016 | ......... H01L 29/4238 |
| JP | 11201700718 | * | 12/2019 | ............ H01L 29/06 |
| JP | 112017007186 | * | 12/2019 | ............ H01L 29/06 |
| WO | WO 2015/049815 A1 | | 4/2015 | |
| WO | WO 2015/072052 A1 | | 5/2015 | |

\* cited by examiner

F I G. 1 4
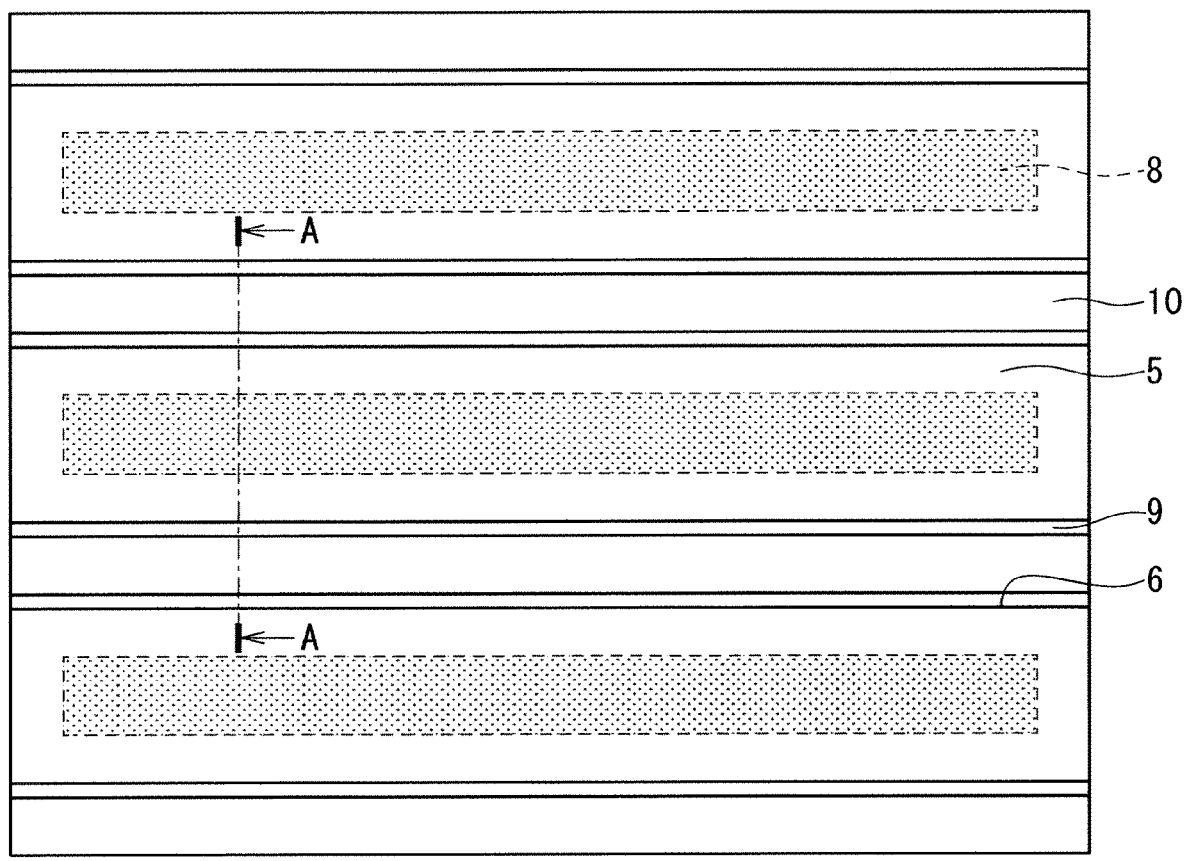

F I G. 1 5
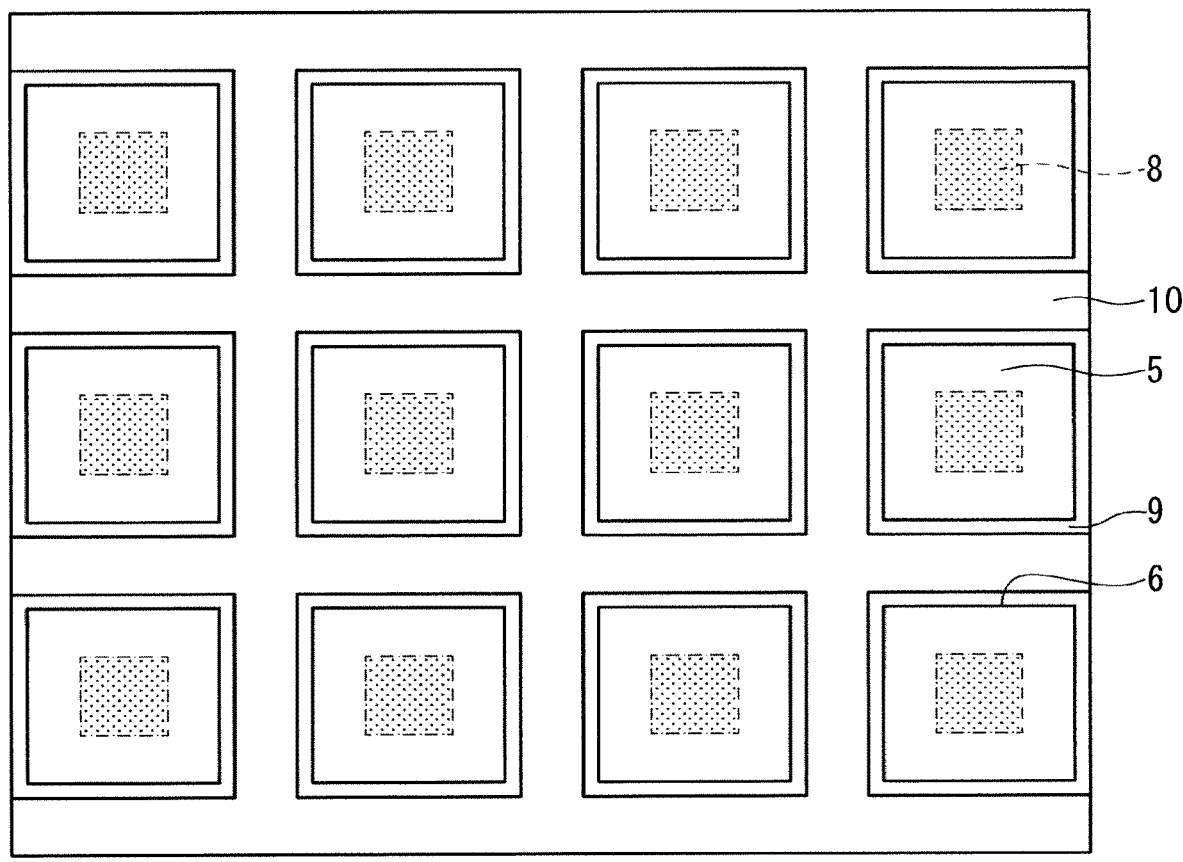

F I G. 1 6
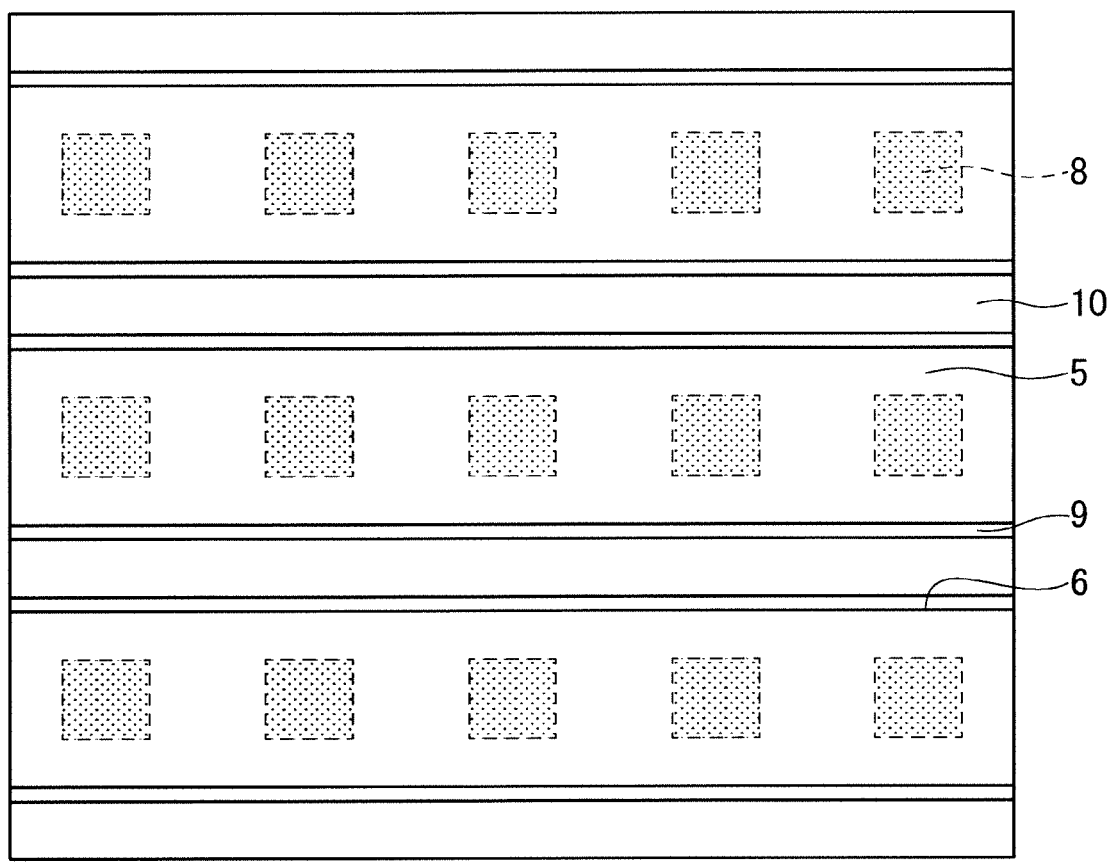

SEMICONDUCTOR DEVICE AND POWER CONVERSION DEVICE

TECHNICAL FIELD

The present invention relates to a semiconductor device, and particularly relates to a semiconductor device including a trench gate.

BACKGROUND ART

In power electronics equipment, a switching device called an insulated gate semiconductor device such as an IGBT (Insulated Gate Bipolar Transistor) and a MOSFET (Metal-Oxide-Semiconductor Field Effect Transistor) is widely used to control power supply to a load such as an electric motor.

One example of such an insulated gate semiconductor device is a trench gate type MOSFET in which a gate electrode is embedded in a semiconductor layer. In the trench gate type MOSFET, by forming trenches in the semiconductor layer and using the side surfaces thereof as a channel region, it is possible to increase a channel width density and improve the performance of the device.

Here, as a next generation semiconductor device capable of achieving a high breakdown voltage and a low loss, a semiconductor device (wide band gap semiconductor device) using a wide band gap semiconductor such as silicon carbide (SiC) attracts attention, and the application of the trench gate type MOSFETs has also been proceeded.

When silicon carbide is used as a semiconductor material, due to its high dielectric breakdown voltage, it is possible to achieve a semiconductor device having a high breakdown voltage, but because a high voltage is applied during an off-state, a high electric field is applied to a gate insulating film, thus increasing the possibility that a defect may occur. Especially, in the trench gate type, the bottom of the trench is located near the substrate, and the electric field easily concentrates on the bottom of the trench geometrically. Therefore, there is concern that the reliability of the gate insulating film deteriorates.

As a method for relaxing the electric field at the bottom of the trench, as disclosed in Patent Document 1, a configuration has been proposed in which the bottom of the trench is covered with an impurity layer having a conductivity type opposite to that of a drift layer, to form a protective layer. Patent Document 1 discloses a configuration in which a trench gate is formed in an n-type drift layer and a p-type protective layer is formed so as to contact the bottom surface of the n-type drift layer, and the bottom of the trench can be protected from the electric field at the time when high bias is applied between a drain electrode and the source electrode, and the field intensity of the gate insulating film formed on the bottom of the trench can be kept low.

By forming the protective layer on the bottom of the trench in this manner, it is possible to protect the bottom of the trench and improve the reliability. Meanwhile, a JFET (Junction Field Effect Transistor) region is formed between the p-type protective layers formed on the bottoms of the adjacent trenches. When the MOSFET is on, a drain current flows through the JFET region sandwiched between the p-type protective layers, but because a depletion layer extending from the protective layer into the drift layer has a certain spread even when the MOSFET is on. Thus, a current path narrows and the on-resistance of the switching device increases.

Therefore, as disclosed in Patent Document 2, a configuration has been proposed in which an n-type impurity layer is formed so as to contact a side surface of a p-type protective layer to form a depletion suppressing layer for suppressing depletion. By forming the n-type impurity layer, it is possible to suppress the extension of the depletion layer from the protective layer and expand the current path. However, along with this, the field intensity at the bottom of the trench increases, and the field intensity of the gate insulating film cannot be kept low. In particular, a corner of the bottom of the trench is not covered with the p-type protective layer, and hence the effect of relaxing the field intensity cannot be expected.

Another example of the configuration for maintaining the on-resistance (ensuring the current path), while reducing the JFET resistance, is to increase the cell spacing (a distance between the trench gates) of the MOSFET, but the number of trenches per unit area decreases. Thus, a channel width density serving as the current path decreases, resulting in an increase in on-resistance. Further, as the distance between the protective layers increases, the field intensity at the bottom of the trench and at the bottom of a body region increases, which leads to reduction in breakdown voltage of the device and deterioration in reliability of the gate insulating film.

PRIOR ART DOCUMENT

Patent Documents

Patent Document 1: International Publication No. WO 2015/072052
Patent Document 2: Japanese Patent Application Laid-Open No. 2005-236267

SUMMARY

Problem to be Solved by the Invention

As described above, in the trench gate type MOSFET, the electric field easily concentrates on the bottom of the trench at the time of application of the high voltage during the off-state. For this reason, as in the trench gate type MOSFETs of Patent Documents 1 and 2, a configuration has been proposed in which a protective layer having a conductivity type opposite to that of the drift layer is formed on the bottom of the trench.

In such a configuration, due to the depletion layer extending from the protective layer, there is a problem that the current path of the drain current narrows between the adjacent protective layers and the on-resistance of the switching device increases.

Therefore, as disclosed in Patent Document 2, when a high-concentration depletion suppressing layer having the same conductivity type as that of the drift layer is formed on the side surface of the protective layer, the extension of the depletion layer can be suppressed and the on-current path widens to enable reduction in the increase in on-resistance, but because the depletion suppressing layer having a higher concentration than the drift layer is in contact with the gate insulating film on the bottom of the trench. Thus, the field intensity at the bottom of the trench increases.

In this manner, when the configuration is adopted to relax the electric field applied to the gate insulating film by providing the protective layer on the bottom of the trench, the current path narrows due to the depletion layer extending from the protective layer into the drift layer to cause an increase in JFET resistance, but in the case of solving such a problem, the field intensity at the bottom of the trench increases.

The present invention has been made to solve a problem as described above, and it is an object of the present invention to provide a semiconductor device having improved the trade-off relationship between relaxation of concentration of an electric field on the bottom of a trench and reduction in on-resistance.

Means to Solve the Problem

A semiconductor device according to the present invention is a semiconductor device including: a semiconductor substrate; a semiconductor layer of a first conductivity type disposed on a first main surface of the semiconductor substrate; a first semiconductor region of the first conductivity type selectively provided in an upper layer portion of the semiconductor layer; a second semiconductor region of a second conductivity type provided in the upper layer portion of the semiconductor layer while contacting the first semiconductor region; a third semiconductor region of the second conductivity type provided contacting a bottom surface of the first and second semiconductor regions; trenches each penetrating the first and third semiconductor regions in a thickness direction and reaching an inside of the semiconductor layer; a gate insulating film covering an inner surface of each of the trenches; a gate electrode embedded in each of the trenches covered with the gate insulating film; a trench-bottom protecting layer of the second conductivity type provided so as to contact a bottom of each of the trenches; a depletion suppressing layer of the first conductivity type provided between adjacent trench-bottom protecting layers; an interlayer insulating film covering tops of the trenches and the first semiconductor region around the trenches and having a contact hole above the first and second semiconductor regions; a first main electrode covering the interlayer insulating film and embedded in the contact hole; and a second main electrode disposed on a second main surface of the semiconductor substrate, wherein the depletion suppressing layer includes an intermediate point that is horizontally equidistant to the adjacent trench-bottom protecting layers, the depletion suppressing layer is formed in such a size as to contact none of the third semiconductor region, the trenches, and the trench-bottom protecting layers, the depletion suppressing layer is provided so as to be located at the same depth and have the same thickness as the trench-bottom protecting layer, and an impurity concentration of the depletion suppressing layer is set higher than an impurity concentration of the semiconductor layer.

Effects of the Invention

According to the present invention, it is possible to improve the trade-off relationship between relaxation of concentration of an electric field on the bottom of the trench and reduction in on-resistance. In addition, the breakdown voltage can be sustained without increasing the field intensity of the bottom of the third semiconductor region being a body region.

BRIEF DESCRIPTION OF DRAWINGS

FIG. 14 is a view showing an example of a planar pattern of a cell of the MOSFET in the first embodiment according to the present invention.

FIG. 15 is a view showing an example of the planar pattern of the cell of the MOSFET in the first embodiment according to the present invention.

FIG. 16 is a view showing an example of the planar pattern of the cell of the MOSFET in the first embodiment according to the present invention.

DESCRIPTION OF EMBODIMENTS

Introduction

Figure 1:
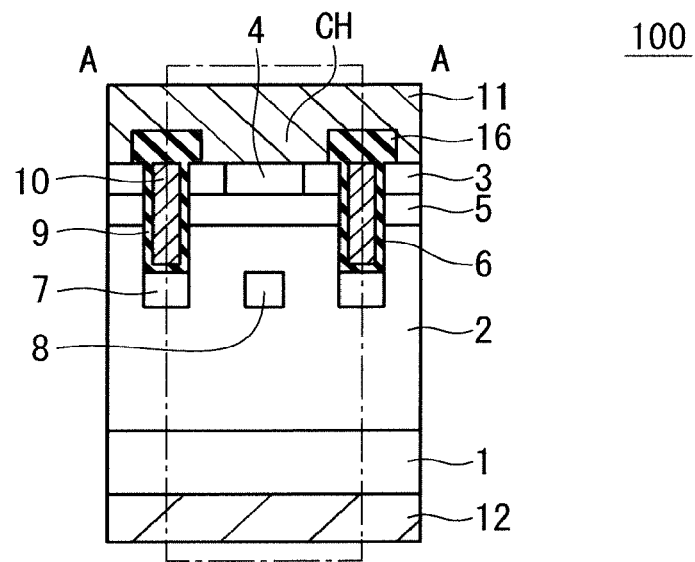
FIG. 1 is a sectional view showing a configuration of one cell of a MOSFET in a first embodiment according to the present invention.

Embodiments according to the present invention will be described below. Note that the present invention is not limited to the following description and can be appropriately changed without departing from the gist of the present invention. Also, in the drawings shown below, the scale of each member may be different from the actual scale in order to facilitate understanding. This also applies to each drawing.

In addition, a term "MOS" has been used in junction structures of metal/oxide/semiconductor in the past and is said to have adopted the acronym of Metal-Oxide-Semiconductor. However, particularly in a field effect transistor having a MOS structure (hereinafter simply referred to as a "MOS transistor"), materials for a gate insulating film and a gate electrode have been improved from the viewpoint of recent integration and improvement in manufacturing step and the like.

For example, in the MOS transistors, polycrystalline silicon has been adopted instead of metal as the material for a gate electrode, mainly from the viewpoint of forming a source/drain in a self-aligned manner. From the viewpoint of improving electrical characteristics, a material having a high dielectric constant is adopted as a material for a gate insulating film, but the material is not necessarily limited to an oxide.

Therefore, the term "MOS" is not necessarily adopted with a limitation only on the laminated structure of metal/oxide/semiconductor, and such a limitation is not assumed in the present specification. That is, in view of technical common sense, "MOS" here has significance not only as an abbreviation derived from its etymology, but also broadly including a laminated structure of a conductor/insulator/semiconductor.

In the following description, an n type is generally defined as a "first conductivity type" and a p type as a "second conductivity type" with respect to a conductivity type of impurities, but the opposite definition may be used.

First Embodiment

<Device Configuration>

FIG. 1 is a sectional view schematically showing a partial configuration of a field effect transistor (SiC-MOSFET) 100 having a MOS structure formed on a SiC substrate. In FIG. 1, the minimum unit structure of the MOS, which is called "cell", is shown enclosed by broken lines, and the actual SiC-MOSFET 100 includes a plurality of cells.

As shown in FIG. 1, the SiC-MOSFET 100 is formed on a SiC substrate 1 containing n-type (first conductivity type) impurities at a relatively high concentration in the range of $1\times10^{18}$ to $1\times10^{21}$ cm$^{-3}$.

On the main surface of the SiC substrate 1, a drift layer 2 (semiconductor layer) containing n-type impurities at a relatively low concentration in the range of $1\times10^{14}$ to $1\times10^{17}$ cm$^{-3}$ is formed. The drift layer 2 is formed by epitaxial growth, for example.

In an upper layer portion of the drift layer 2, a source region 3 (first semiconductor region) containing n-type impurities (donor impurities) of approximately $1\times10^{19}$ cm$^{-3}$ is disposed, and a body contact region 4 (second semiconductor region) containing p-type (second conductivity type) impurities (acceptor impurities) of approximately $1\times10^{20}$ cm$^{-3}$ is disposed so as to be sandwiched by the source region 3.

A body region 5 (third semiconductor region) containing p-type impurities at a relatively low concentration in the range of $1\times10^{14}$ to $1\times10^{18}$ cm$^{-3}$ is provided so as to contact the bottom surfaces of the source region 3 and the body contact region 4.

Two trenches 6 penetrating the source region 3 and the body region 5 in a thickness direction and reaching the inside of the drift layer 2 are provided so as to sandwich the body contact region 4. A gate insulating film 9 is provided so as to cover the inner surface of the trench 6, and a gate electrode 10 is embedded in the trench 6 covered with the gate insulating film 9. The tops of the trench 6 and the source region 3 around the trench 6 are covered with an interlayer insulating film 16, and a contact hole CH reaching the source region 3 and the body contact region 4 is provided in the interlayer insulating film 16. Although the gate electrode 10 is covered with the interlayer insulating film 16, a gate voltage is supplied via an opening of the interlayer insulating film 16 which is provided in a part not shown.

A source electrode 11 (first main electrode) is provided so as to cover the interlayer insulating film 16 and to fill in the contact hole CH, and a drain electrode 12 (second main electrode) is provided on the main surface of the SiC substrate 1 on the side opposite to the side where the source electrode 11 is provided.

In the drift layer 2, a trench-bottom protecting layer 7 having approximately the same width as the width of the trench 6 is provided so as to contact the bottom surface of the trench 6. The trench-bottom protecting layer 7 contains p-type impurities at a relatively high concentration in the range of $1\times10^{17}$ to $1\times10^{19}$ cm$^{-3}$, and its thickness is set in the range of 0.1 to 2.0 µm.

Then, in the drift layer 2 between the adjacent trench-bottom protecting layers 7, an n-type depletion suppressing layer 8 having an impurity concentration higher than that of the drift layer 2 is provided so as to include an intermediate point that is horizontally (parallelly to the main surface of the substrate) equidistant to the two adjacent trench-bottom protecting layers 7. The depletion suppressing layer 8 is formed to have such a size as to contact none of the body region 5, the trenches 6, and the trench-bottom protecting layers 7. In FIG. 1, the depletion suppressing layer 8 is provided such that its horizontal center matches the horizontal center between the trench-bottom protecting layers 7, that is, the depletion suppressing layer 8 is equidistance from either trench-bottom protecting layer 7.

When the depletion suppressing layer 8 containing n-type impurities at a higher concentration than the drift layer 2 is provided, it is possible to suppress the extension of the depletion layer within the depletion suppressing layer 8 and to prevent overlapping of the depletion layers extending from the two trenches 6. Meanwhile, providing the depletion suppressing layer 8 causes a slight increase in the electric field at the bottom of the trench 6, so that the impurity concentration of the depletion suppressing layer 8 is set higher than a concentration for preventing overlapping of the depletion layers extending from the two adjacent trench-bottom protecting layers 7 during the on-state of the MOSFET and set to such an extent as to suppress an amount of increase in the electric field at the bottom of the trench 6 to, for example, 30% or less at the time of application of a high bias during the off-state of the MOSFET, e.g., in the range of $1 \times 10^{16}$ to $1 \times 10^{18}$ cm$^{-3}$ or in the range of 2 to 100 times as high as in the drift layer 2.

The width of the depletion suppressing layer 8 is set within the range of 5 to 50% of the cell pitch of the MOSFET (a distance between the centers of the trench gates) so that the bottom of the trench 6 does not become a high electric field when the high bias is applied. In order to suppress the depletion layer horizontally extending from the trench-bottom protecting layer 7 when the MOSFET is on, and to sustain the breakdown voltage by sufficient extension of the depletion layer in the drift layer 2 when the MOSFET is off, the depletion suppressing layer 8 is desirably provided so as to be located at the same depth as the trench-bottom protecting layer 7, and is set so as to have a thickness in the range of 0.1 to 2.0 µm which is the same as the thickness of the trench-bottom protecting layer 7.

Figure 2:
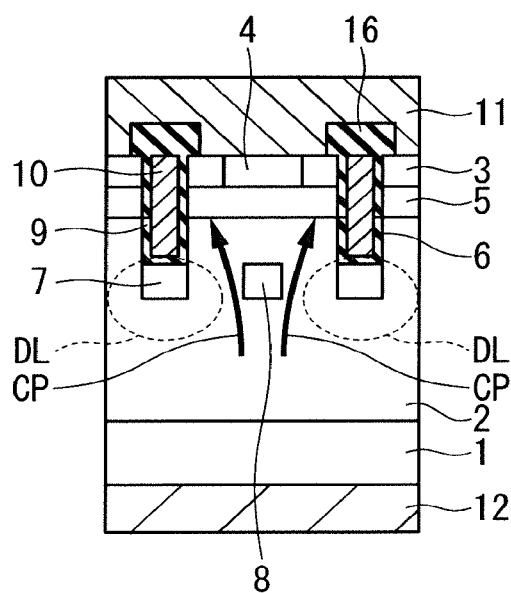
FIG. 2 is a view showing a depletion layer formed when the MOSFET is on in the first embodiment according to the present invention.
Figure 3:
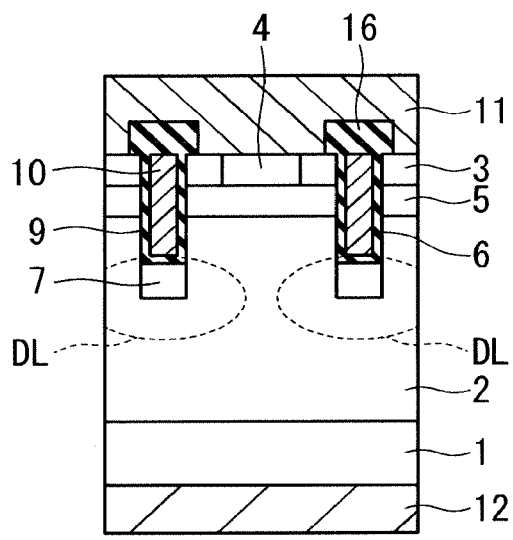
FIG. 3 is a view showing a depletion layer formed when the MOSFET is on in a case where no depletion suppressing layer is provided.

In FIG. 2, depletion layers DL which are formed when the MOSFET is on are indicated by broken lines, and the extension of the depletion layers from the two adjacent trench-bottom protecting layers 7 is suppressed. FIG. 3 shows, by using broken lines, the depletion layers DL formed when the MOSFET is on in a case where the depletion suppressing layer 8 is not provided, and the depletion layers DL extend from the trench-bottom protecting layers 7 to the central portion between the trench gates. Due to the influence of the depletion layers DL, a JFET region formed between the adjacent trench-bottom protecting layers 7 narrows and an on-current path narrows, to increase the JFET resistance.

On the other hand, as shown in FIG. 2, when the depletion suppressing layer 8 having an impurity concentration higher than the impurity concentration of the drift layer 2 is provided between the trench-bottom protecting layers 7, the extension of the depletion layer DL is reduced and the on-current path expands, to decrease the JFET resistance.

Further, the expansion of the on-current path makes the influence of the increase in the JFET resistance hardly exerted even when the cell pitch is narrowed as compared with the conventional case, and it is thus possible to suppress a decrease in a channel width density due to expansion of the cell pitch for avoiding an increase in the JFET resistance and to suppress an increase in the on-resistance. Moreover, the distance between the trench-bottom protecting layers 7 decreases due to reduction in the cell pitch to reduce the field intensity at the bottom of the trench 6, so that it is possible to improve the breakdown voltage and the reliability of the gate insulating film 9. As a result, a higher on-resistance reduction effect can be obtained. Although the width of the depletion layer increases with increase in its temperature, the increase in the JFET resistance can be suppressed by the depletion suppressing layer 8, thereby also enabling improvement in the temperature characteristic of the on-resistance.

Figure 4:
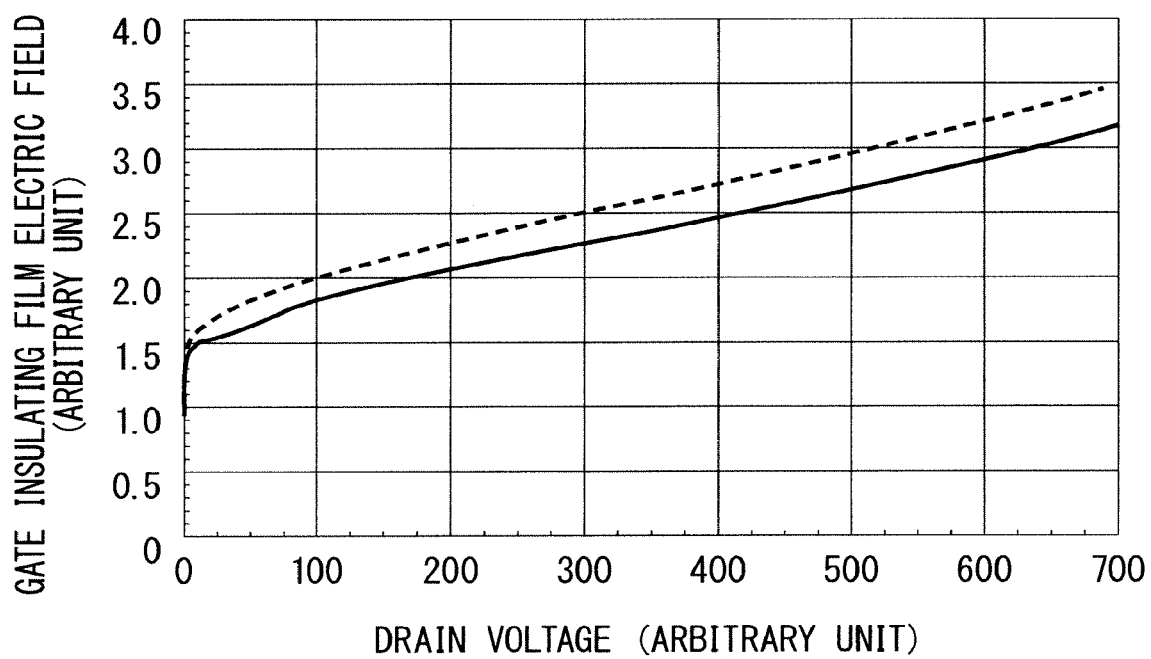
FIG. 4 is a graph showing simulation results of the MOSFET of the first embodiment according to the present invention and a conventional MOSFET.
Figure 5:
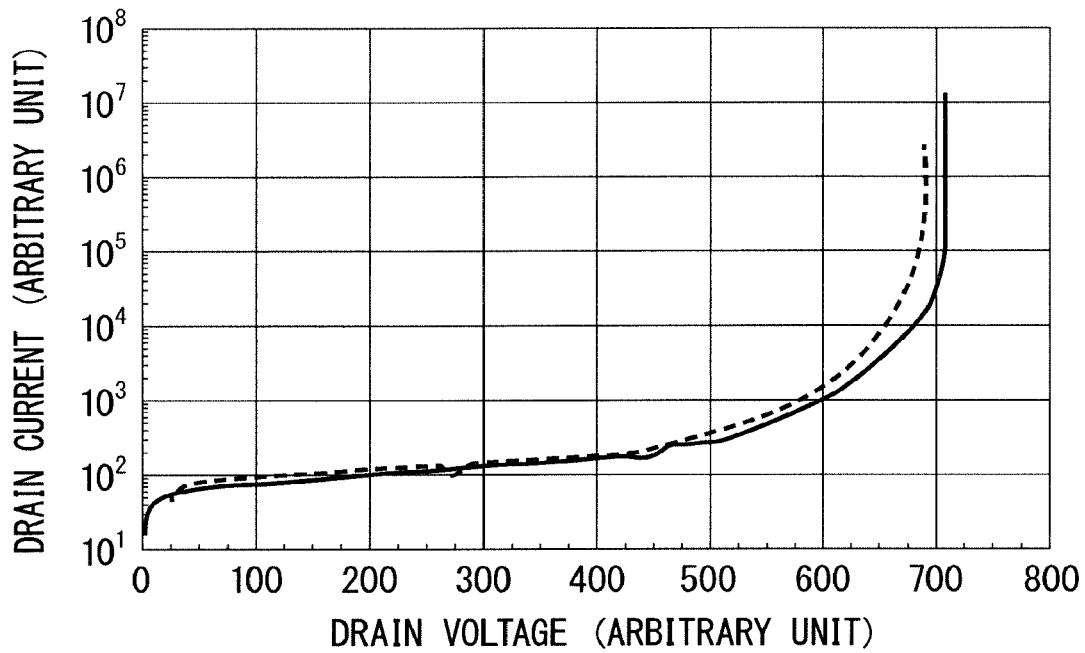
FIG. 5 is a graph showing simulation results of the MOSFET of the first embodiment according to the present invention and the conventional MOSFET.

FIGS. 4 and 5 are graphs showing simulation results in a conventional configuration in which an n-type impurity layer is formed so as to contact the side surface of a p-type protective layer and in the configuration of the SiC-MOSFET 100 shown in FIG. 1.

FIG. 4 is a graph showing characteristics of the field intensity (arbitrary unit) of the gate insulating film with respect to a change in the drain voltage (arbitrary unit) during the off-state of the MOSFET, FIG. 5 is a graph showing characteristics of a drain current (arbitrary unit) with respect to a change in the drain voltage (arbitrary unit) during the off-state of the MOSFET, and in each of FIGS. 4 and 5, the characteristic in the conventional configuration is indicated by a broken line and the characteristic in the configuration of FIG. 1 is indicated by a solid line.

It is found from FIGS. 4 and 5 that in the configuration of FIG. 1 in which the depletion suppressing layer 8 is provided at a position distant from the trench 6 and the trench-bottom protecting layer 7, the field intensity at the bottom of the trench is reduced and the field intensity of the gate insulating film and the drain current during the off-state of the MOSFET are reduced as compared with the conventional configuration. This results in improvement in the breakdown voltage and the reliability of the gate insulating film 9.

In addition, with the depletion suppressing layer 8 formed at a position distant also from the body region 5, the field intensity at the bottom of the body region 5 does not increase during the off-state, to improve the reliability of the gate insulating film 9 without a decrease in breakdown voltage.

As described above, by providing the depletion suppressing layer 8, the width of the depletion layer, horizontally extending from the trench-bottom protecting layer 7 into the drift layer 2 when the device is on, is reduced and the on-current path in the JFET region is expanded, so that it is possible to reduce the JFET resistance generated between the trench-bottom protecting layers 7 and to reduce the on-resistance of the MOSFET.

Further, by disposing the depletion suppressing layer 8 away from the body region 5, the trench 6, and the trench-bottom protecting layer 7, it is possible to improve the breakdown voltage and reduce the field intensity of the gate insulating film 9 as compared with the conventional structure in which the depletion suppressing layer and the trench-bottom protecting layer are adjacent to each other.

Moreover, it is possible to reduce the cell pitch, and is possible to increase the channel width density and relax the electric field on the bottom of the trench. These effects bring improvement in the reduction in the on-resistance, the reliability of the gate insulating film, and the breakdown voltage, thus improving a trade-off between on-characteristics and off-characteristics of the device.

<Manufacturing Method>

Next, with reference to FIGS. 6 to 13 being sectional views sequentially showing manufacturing steps, a manufacturing method for the SiC-MOSFET 100 will be described. In the following description, materials given as examples can be appropriately changed to materials having equivalent functions.

Figure 6:
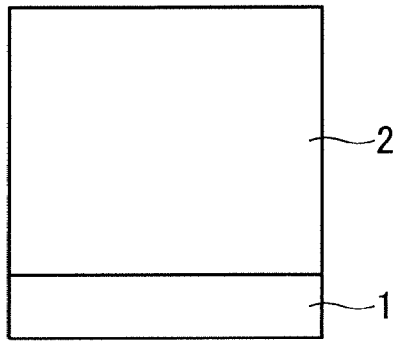
FIG. 6 is a sectional view for describing a manufacturing step of the MOSFET in the first embodiment according to the present invention.

First, in the step shown in FIG. 6, a SiC substrate 1 containing n-type impurities in the range of $1\times10^{18}$ to $1\times10^{21}$ cm$^{-3}$ is prepared, and an n-type silicon carbide layer is formed on one main surface of the SiC substrate 1 by epitaxial growth to form the drift layer 2. The impurity concentration of the drift layer 2 is in the range of $1\times10^{14}$ to $1\times10^{17}$ cm$^{-3}$. Note that the thickness of the SiC substrate 1 is 50 to 400 μm and the thickness of the drift layer 2 is 5 to 150 μm.

Figure 7:
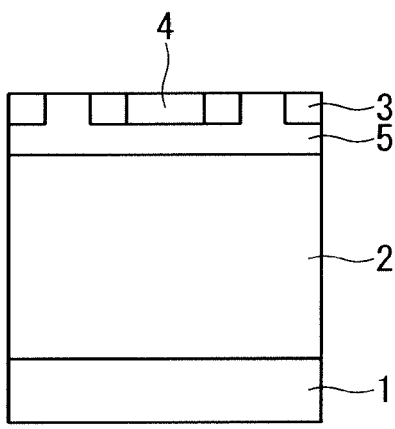
FIG. 7 is a sectional view for describing the manufacturing step of the MOSFET in the first embodiment according to the present invention.

Next, in the step shown in FIG. 7, the body region 5 is formed in the upper layer portion of the drift layer 2, and the source region 3 and the body contact region 4 are selectively formed in the upper layer portion of the body region 5. The body region 5, the source region 3, and the body contact region 4 can be formed by ion implantation or epitaxial growth, and the order of formation is not limited. As an example, after formation of the body region 5 by ion implantation or epitaxial growth, the source region 3 is selectively formed by ion implantation of n-type impurities in the upper layer portion of the body region 5, and then the body contact region 4 is selectively formed by ion implantation of p-type impurities in a part of the source region 3. Note that the impurity concentration of the body region 5 is set in the range of $1\times10^{14}$ to $1\times10^{18}$ cm$^{-3}$ and the thickness thereof is set in the range of 0.2 to 1.0 μm. The concentration and the thickness may not be uniform. Further, the impurity concentration of the source region 3 is set to approximately $1\times10^{19}$ cm$^{-3}$, the thickness is set in the range of 0.2 to 0.5 μm, the impurity concentration of the body contact region 4 is set to approximately $1\times10^{20}$ cm$^{3}$, the thickness is set to be approximately the same as that of the source region 3.

Figure 8:
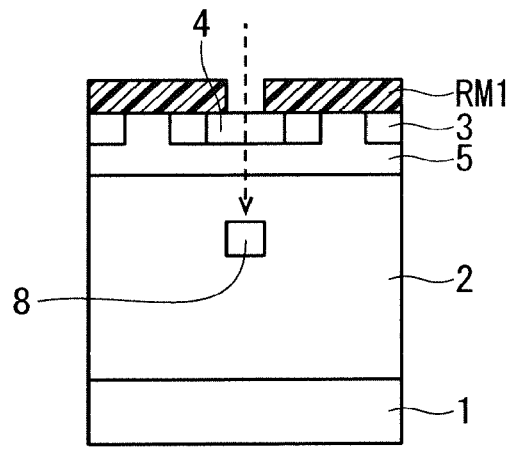
FIG. 8 is a sectional view for describing the manufacturing step of the MOSFET in the first embodiment according to the present invention.

Next, in the step shown in FIG. 8, a resist mask RM1 having a pattern, in which an opening is provided above a region where the depletion suppressing layer 8 is to be formed, is formed on the SiC substrate 1 in a state where the source region 3 and the like are formed by photolithography technique, and ion implantation of n-type impurities is performed from above the resist mask RM1 to form the depletion suppressing layer 8 in the drift layer 2. Note that this ion implantation may be performed before or after formation of the source region 3, the body contact region 4, and the body region 5 as long as the drift layer 2 has been formed.

Alternatively, ion implantation may be performed during the formation of the drift layer 2 to form the depletion suppressing layer 8. That is, when the epitaxial growth of the drift layer 2 is in progress and the thickness of the drift layer 2 becomes larger than the position of the upper surface of the depletion suppressing layer 8, ion implantation of n-type impurities is selectively performed to form the depletion suppressing layer 8. Thereafter, the epitaxial growth of the drift layer 2 is started again, to obtain a configuration in which the depletion suppressing layer 8 is embedded in the drift layer 2. When this method is adopted, the implantation depth at the time of ion implantation can be made small to enable implantation at a low acceleration voltage, and it is thus possible to suppress excessive diffusion, generation of crystal defects, and the like due to implantation of high energy ions. This eliminates the need for ion implantation at a high acceleration voltage, and hence there is also an advantage that equipment costs related to ion implantation can be reduced.

When the above method is adopted, in order to recover damage such as a crystal defect due to ion implantation, heat treatment (annealing) may be performed after ion implantation, or an oxide film may be formed on the surface of the drift layer 2 after ion implantation (sacrificial oxidation) and the oxide film may then be removed by etching, to remove the damage on the surface of the drift layer 2 together with the oxide film, and thereafter, the epitaxial growth may be performed again to grow the drift layer 2 to a predetermined height.

Figure 9:
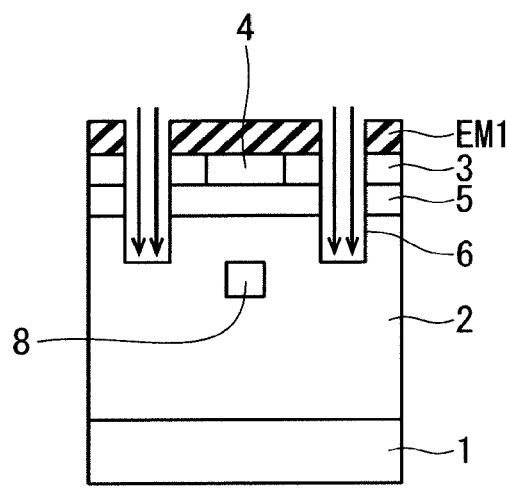
FIG. 9 is a sectional view for describing the manufacturing step of the MOSFET in the first embodiment according to the present invention.

After removal of the resist mask RM1, in the step shown in FIG. 9, a silicon oxide film is formed on the SiC substrate 1, and a resist mask having a pattern, in which an opening is provided above a region where the trench 6 is to be formed, is formed on the silicon oxide film by photolithography technique. The silicon oxide film is then patterned by an etching process by using the resist mask as an etching mask, to thereby obtain an etching mask EM1 having an opening above the region where the trench 6 is to be formed. Using the etching mask EM1, trenches 6 penetrating the source region 3 and the body region 5 in the thickness direction are formed by reactive ion etching. The depth of the trench 6 is equal to or larger than the depth of the body region 5 and is set to a depth of 1.0 to 6.0 μm.

Figure 10:
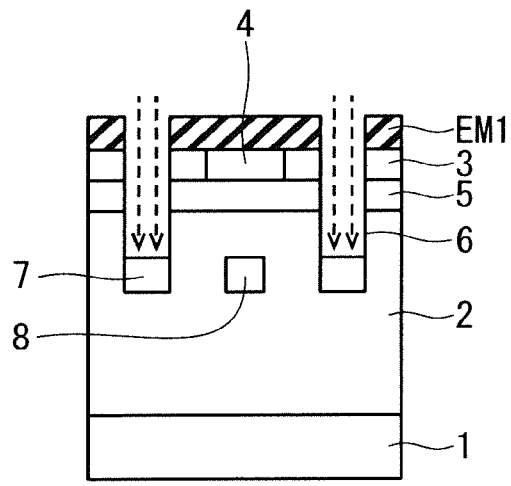
FIG. 10 is a sectional view for describing the manufacturing step of the MOSFET in the first embodiment according to the present invention.

Next, in the step shown in FIG. 10, by using the etching mask EM1 as an implantation mask, p-type impurities are ion-implanted into the drift layer 2 below the bottom surface of the trench 6 to form the trench-bottom protecting layer 7. The concentration of the p-type impurities in the trench-bottom protecting layer 7 is set in the range of $1\times10^{17}$ to $1\times10^{19}$ cm$^{-3}$, and the thickness thereof is set in the range of 0.1 to 2.0 μm.

Instead of ion implantation, the trench-bottom protecting layer 7 may be formed in the trench 6 by epitaxial growth after formation of the trench 6 deep by the thickness of the trench-bottom protecting layer 7 (0.1 to 2.0 μm). Note that the concentration and thickness of the trench-bottom protecting layer 7 may not be uniform.

After removal of the etching mask EM1, annealing is performed by using a heat treatment device (annealing device) to activate the impurities ion-implanted in the previous steps. This annealing is performed in an atmosphere of inert gas such as argon (Ar) gas or in a vacuum, at a temperature in the range of 1300° C. to 1900° C. for 30 seconds to one hour.

Figure 11:
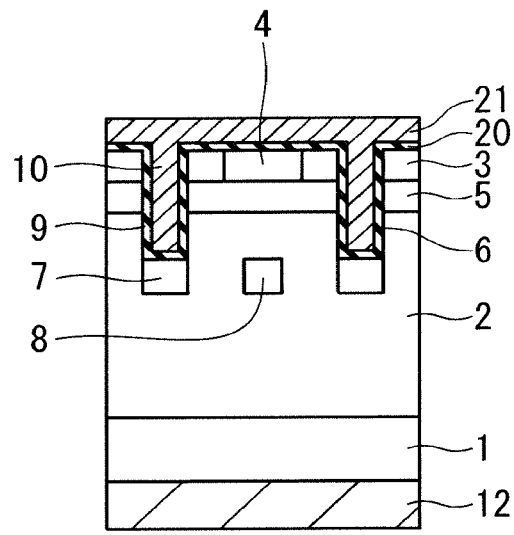
FIG. 11 is a sectional view for describing the manufacturing step of the MOSFET in the first embodiment according to the present invention.

Next, in the step shown in FIG. 11, after formation of an insulating film 20 of, for example, silicon oxide so as to cover at least the inner surface of the trench 6, a conductive film 21 made of, for example, conductive polysilicon is formed on the insulating film 20, and the conductive film 21 is embedded in the trench 6. Thereafter, the conductive film 21 and the insulating film 20 are patterned or etched back such that the gate insulating film 9 and the gate electrode 10 remain only in the trench 6.

Here, the film thickness of the insulating film 20 at the bottom of the trench 6 may be larger than the film thickness of the insulating film 20 in the side surface portion of the trench 6. Although the thickness of the gate insulating film 9 shown in FIG. 1 is the same for both the side surface portion and the bottom, only the side surface portion actually contributes to the operation of the MOSFET as the gate insulating film, and the bottom does not contribute to the operation as the MOSFET. In addition, as described above, the electric field easily concentrates on the bottom of the trench 6 and dielectric breakdown easily occurs. Therefore, by selectively making thick the gate insulating film at the bottom in addition to provision of the trench-bottom protecting layer 7, it is possible to further relax the influence of the electric field applied to the gate insulating film 9.

Figure 12:
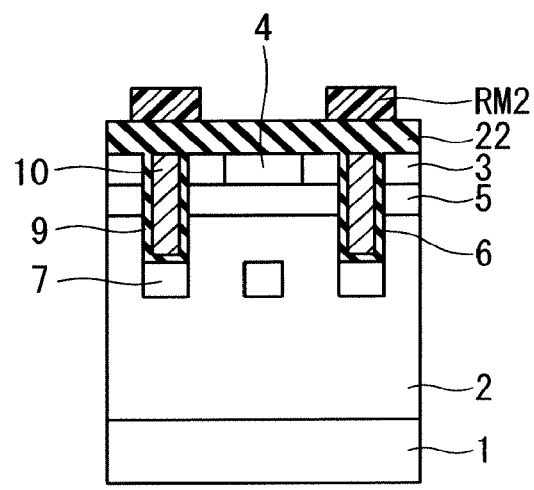
FIG. 12 is a sectional view for describing the manufacturing step of the MOSFET in the first embodiment according to the present invention.
Figure 13:
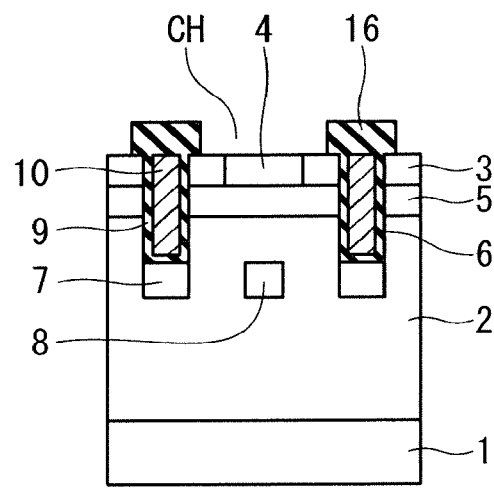
FIG. 13 is a sectional view for describing the manufacturing step of the MOSFET in the first embodiment according to the present invention.

Next, in the step shown in FIG. 12, an insulating film 22 is formed of, for example, silicon oxide so as to cover the SiC substrate 1, and covers the gate insulating film 9 and the gate electrode 10 in the trench 6 exposed on the surface of the source region 3. By using the photolithography technique, a resist mask RM2 is formed having a pattern in which an opening is provided above the source region 3 and the body contact region 4 and the tops of the trench 6 and the source region 3 around the trench 6 are covered. Using the resist mask RM2 as an etching mask, the insulating film 22 is then patterned by the etching processing to form the interlayer insulating film 16 having a contact hole CH that reaches the source region 3 and the body contact region 4 and covering the tops of the trenches 6 and the source region 3 around the trench 6, as shown in FIG. 13.

Next, the source electrode 11 which covers the interlayer insulating film 16 and fills in the contact hole CH is formed. In order for the source electrode 11 to come into ohmic contact with the source region 3 and the body contact region 4, first, a metal film containing, for example, Ni (nickel) as a main component is formed on the entire surface of the drift layer 2 including the inside of the contact hole CH by sputtering or the like, and is reacted with silicon carbide by heat treatment at 600° C. to 1100° C. to form a nickel silicide film (not shown) to be an ohmic electrode. Thereafter, the unreacted metal film on the interlayer insulating film 16 is removed by wet etching. Heat treatment may be performed again after removal of the metal film on the interlayer insulating film 16. In this case, the ohmic contact with even lower contact resistance is formed by performing the heat treatment at a higher temperature than that in the previous heat treatment. Then, a metal film of an Al (aluminum) alloy or the like is formed by sputtering or the like so as to cover the silicide film and the interlayer insulating film 16, whereby the source electrode 11 is formed on the interlayer insulating film 16 and the contact hole CH, As a result, the source electrode 11 is electrically connected to the source region 3 and the body contact region 4 via the nickel silicide film to be an ohmic electrode, so that the source electrode 11 substantially comes into ohmic contact with the source region 3 and the body contact region 4 to enable reduction in the contact resistance.

Finally, a metal film of an Al alloy is formed by sputtering or the like on the main surface of the SiC substrate 1 on the side opposite to the side where the source electrode 11 is provided, to form the drain electrode 12 and obtain the SiC-MOSFET 100 having the cell structure shown in FIG. 1.

Here, FIG. 14 shows an example of the planar pattern of the cell of the SiC-MOSFET 100. FIG. 14 shows a cell of a planar pattern in which the trenches 6 are in a stripe shape, and a cross section taken along line A-A of FIG. 14 in the direction of arrows corresponds to the sectional view of FIG. 1. In FIG. 14, for the sake of simplicity, the configuration above the source region 3 and the body contact region 4 is omitted, and the body region 5, the gate insulating film 9 and the gate electrode 10 in the trench 6 are seen from above, but for convenience sake, the depletion suppressing layer 8 is indicated as surrounded by a broken line.

As shown in FIG. 14, the depletion suppressing layer 8 is provided along the extending direction of the trench 6, but has a length not the same as the length of the trench 6 and is configured to have been divided into a predetermined length.

FIG. 15 is a view showing another example of the planar pattern of the cell of the SiC-MOSFET 100, which shows a cell with a planar pattern in which the trenches 6 have a lattice shape. When the trench 6 has a lattice shape, the shape in plan view of the cell surrounded by the trench 6 in the lattice shape is a quadrangle, but is not limited to a square. The shape in plan view of the cell surrounded by the trench 6 may be a rectangle, a polygon, or may have each corner with curvature. In addition, the trenches 6 may be formed such that quadrangular cells are arranged in a zigzag manner.

FIG. 16 is a view showing another example of the planar pattern of the cell of the SiC-MOSFET 100, and in the planar pattern in which the trenches 6 are formed in the stripe shape, the quadrangular depletion suppressing layers 8 are provided in a discontinuous manner along the extending direction of the trenches 6. Such an arrangement is called an island shape.

Although not shown in FIGS. 14 to 16, the trench-bottom protecting layer 7 has the same length as the length of the trench 6 along the extending direction of the trench 6, and the source regions 3 and the body contact regions 4 are provided in the stripe shape or the island shape in accordance with the shape of the trenches 6.

The depletion suppressing layer 8 may only be provided in the central portion between the trench-bottom protecting layers 7 (not shown) so as to be horizontally equidistant from the trench-bottom protecting layer 7 surrounding the depletion suppressing layer 8, and the depletion suppressing layers 8 are formed in the stripe shape as shown in FIG. 14 or the island shape as shown in FIGS. 15 and 16. Note that the shape in plan view of the depletion suppressing layer 8 is not limited to the square or the rectangle but may be a polygon or may have each corner with curvature.

Further, it is desirable that the trench-bottom protecting layer 7 be connected to the source electrode 11 and the potential be fixed (grounded). A configuration of a connection part (potential fixing portion) between the trench-bottom protecting layer 7 and the source electrode 11 will be described with reference to FIGS. 17 and 18.

Figure 17:
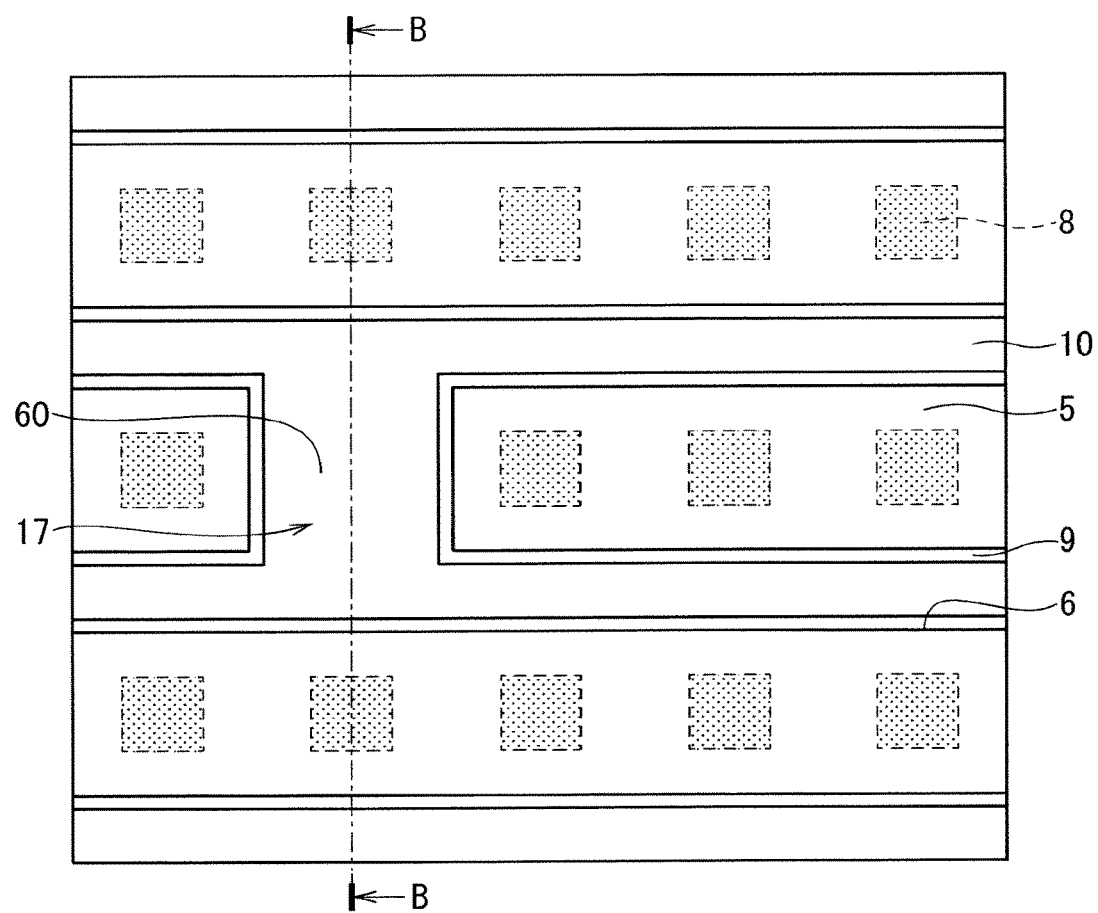
FIG. 17 is a plan view showing a configuration of a potential fixing portion of a trench-bottom protecting layer and a source electrode.
Figure 18:
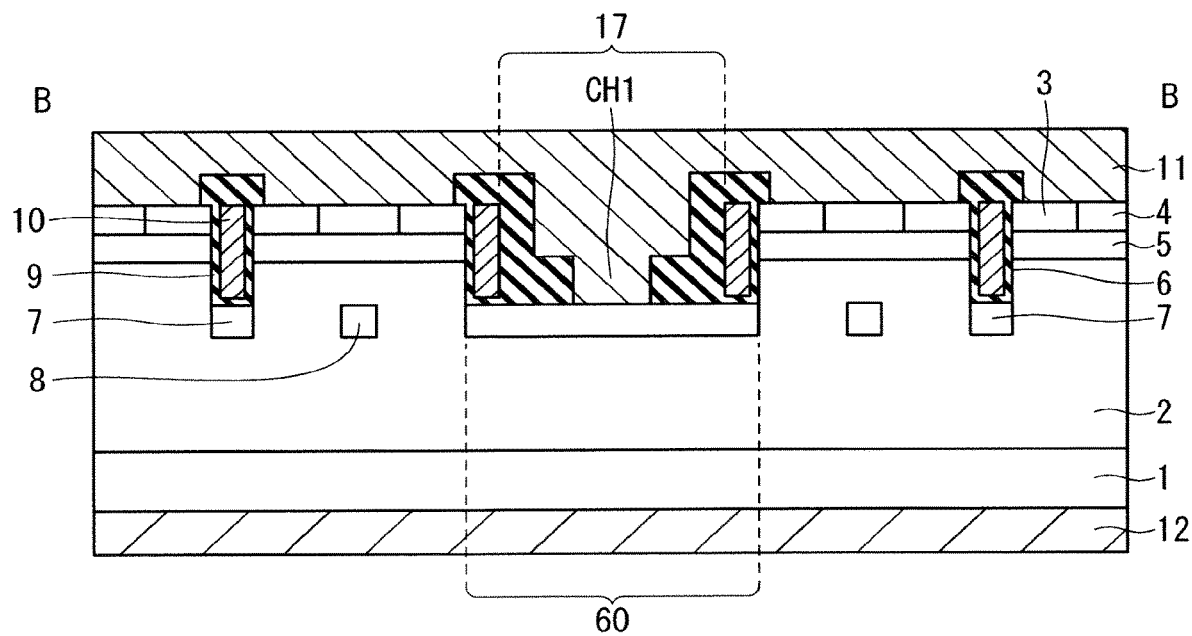
FIG. 18 is a sectional view showing the configuration of the potential fixing portion of the trench-bottom protecting layer and the source electrode.

FIG. 17 is a plan view showing the configuration of the potential fixing portion, and FIG. 18 is a sectional view showing a sectional configuration taken along line B-B in FIG. 17. FIG. 17 illustrates a configuration in which the depletion suppressing layers 8 are arranged in the island shape in a planar pattern in which the trenches 6 are formed in the stripe shape, and the shape in plan view is configured such that, out of a plurality of body regions 5 defined in the stripe shape by the trenches 6, one body region 5 is divided by a trench 60 in the middle, and this is a potential fixing portion 17.

That is, as shown in FIG. 18, in the potential fixing portion 17, the trench 60 having a width larger than that of the trench 6 is provided so as to extend between the cells, and the trench-bottom protecting layer 7 having approximately the same width as the width of the trench 60 is provided so as to contact the bottom surface of the trench 60. The side surface of the trench 60 is covered with the gate insulating film 9 and covered with the gate electrode 10 via the gate insulating film 9. The inner surface of the trench 60 is covered with the interlayer insulating film 16 so as to include the gate electrode 10, but a contact hole CH1 penetrating the interlayer insulating film 16 and reaching the trench-bottom protecting layer 7 is provided at the bottom of the trench 60. The source electrode 11 is provided so as to embed the inside of the trench 60 with its inner surface covered with the interlayer insulating film 16 and is electrically connected to the trench-bottom protecting layer 7 via the contact hole CH1, so that the potential of the trench-bottom protecting layer 7 can be fixed to the source potential.

Figure 19:
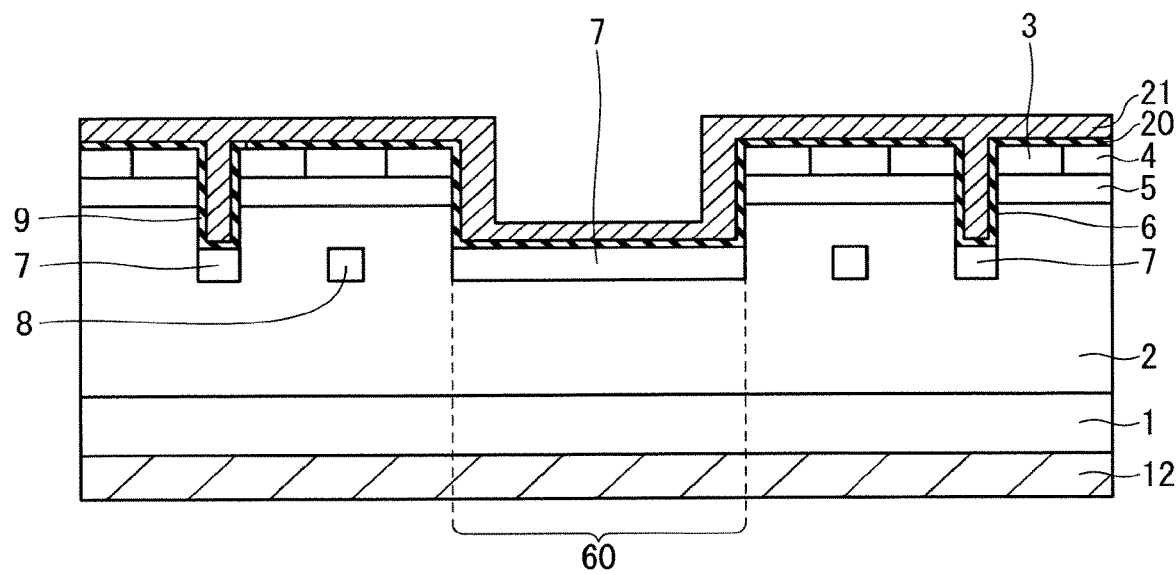
FIG. 19 is a sectional view for describing a step of forming the potential fixing portion.

Next, steps of forming the potential fixing portion 17 will be described with reference to FIGS. 19 to 21. Note that FIGS. 19 to 21 are sectional views showing the steps of forming the potential fixing portion in the manufacturing step described above with reference to FIGS. 11 to 13, the same components as the components described with reference to FIGS. 11 to 13 are denoted by the same reference numerals, and repeated descriptions are omitted.

After formation of the trenches 6 and 60 through the steps described with reference to FIGS. 6 to 10, in the step shown in FIG. 19, the insulating film 20 is formed so as to cover the inner surfaces of the trenches 6 and 60, and the conductive film 21 is formed on the insulating film 20 to embed the conductive film 21 into the trench 6 and cover the inner surface of the trench 60 with the conductive film 21. Thereafter, the conductive film 21 and the insulating film 20 are patterned or etched back such that the gate insulating film 9 and the gate electrode 10 remain only in the trenches 6 and 60. Here, the conductive film 21 formed on the side surface of the trench 60 is formed with a large thickness as compared with the thickness of the conductive film 21 formed in a flat part such as the bottom surface of the trench, because a conductive film horizontally deposited from the side surface and a conductive film vertically deposited from the bottom overlap. Therefore, by controlling the etch-back time, the conductive film 21 in the flat part is removed, and the gate electrode 10 can be formed on the side surface of the trench 60 leaving the conductive film 21.

Figure 20:
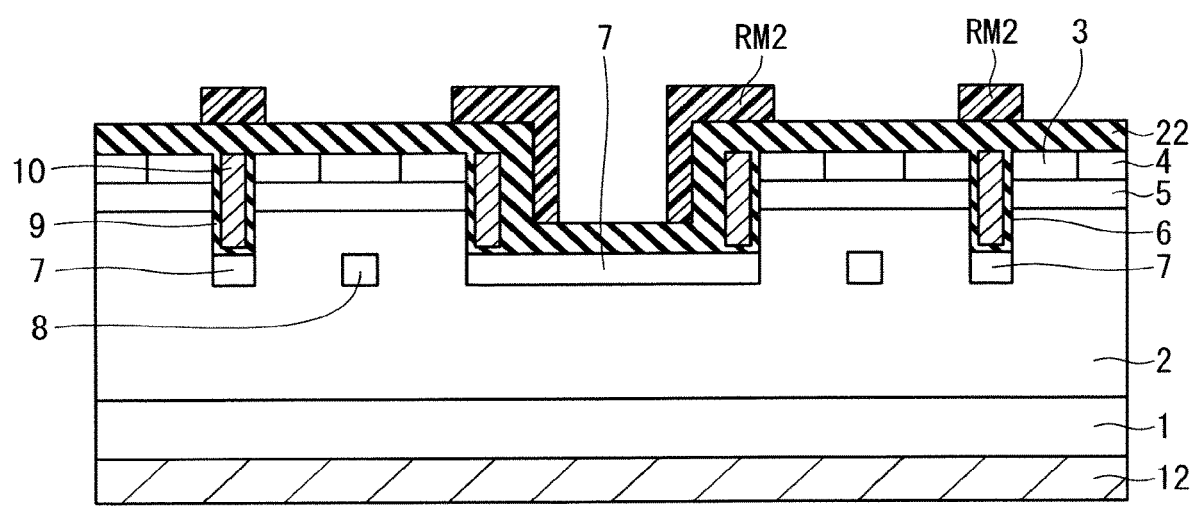
FIG. 20 is a sectional view for describing the step of forming the potential fixing portion.
Figure 21:
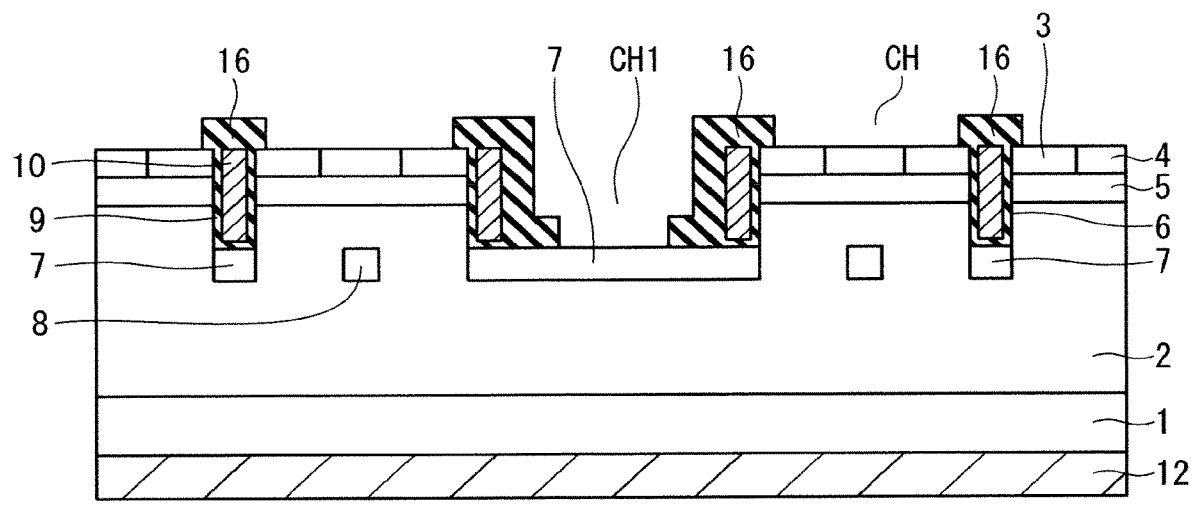
FIG. 21 is a sectional view for describing the step of forming the potential fixing portion.

Next, in the step shown in FIG. 20, the insulating film 22 is formed so as to cover the SiC substrate 1, and covers the gate insulating film 9 and the gate electrode 10 in the trench 6 exposed on the surface of the source region 3 and covers the side surface of gate electrode 10 together with the inner surface of the trench 60. By using the photolithography technique, a resist mask RM2 is formed in which an opening is provided above the source region 3 and the body contact region 4 and in the central portion on the bottom surface of the trench 60. The insulating film 22 using the resist mask RM2 as an etching mask is then patterned by the etching processing, to form the interlayer insulating film 16 having a contact hole CH that reaches the source region 3 and the body contact region 4 and a contact hole CH1 that reaches the trench-bottom protecting layer 7 in the central portion on the bottom surface of the trench 60, as shown in FIG. 21.

Thereafter, the potential fixing portion 17 shown in FIG. 18 is obtained by forming the source electrode 11 that covers the interlayer insulating film 16 and embeds the insides of the contact holes CH and CH1, and the potential of the trench-bottom protecting layer 7 is fixed to the source potential, so that the field intensity of the gate insulating film 9 on the bottom of the trench can be kept low. Although only one potential fixing portion 17 is shown in FIG. 17, when the trenches 6 are formed in the stripe shape, the potentials of the trench-bottom protecting layers 7 at the bottoms of the two trenches 6 are fixed by one potential fixing portion, and hence one potential fixing portion is provided for every two remaining trenches 6.

In formation of the source electrode 11, as described above, a nickel silicide film to be an ohmic electrode is first formed on the bottom surface of the contact hole CH. This is also the same in the contact hole CH1, the source electrode 11 is electrically connected to the trench-bottom protecting layer 7 via a silicide film to be an ohmic electrode, and the source electrode 11 substantially comes into ohmic contact with the trench-bottom protecting layer 7 to enable reduction in the contact resistance.

<First Modification>

Figure 22:
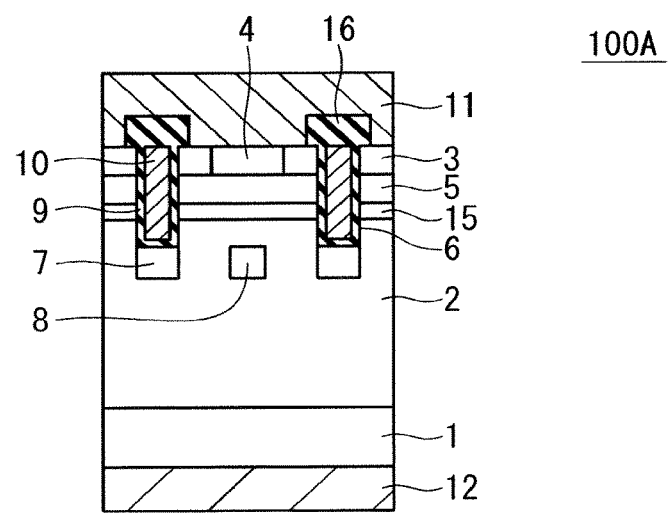
FIG. 22 is a sectional view showing a configuration of one cell of a MOSFET in a first modification of the first embodiment according to the present invention.

Next, a configuration of a SiC-MOSFET 100A according to a first modification of the first embodiment will be described with reference to FIG. 22. In FIG. 22, the same components as those of the SiC-MOSFET 100 described with reference to FIG. 1 are denoted by the same reference numerals, and repeated descriptions are omitted.

As shown in FIG. 22, the SiC-MOSFET 100A includes an impurity region 15 provided in the drift layer 2 below the body region 5 so as to contact the bottom surface of the body region 5. The impurity region 15 has n-type impurities at a high concentration in the range of 5 to 100 times larger than that of the drift layer 2, and more specifically has n-type impurities at a concentration in the range of $1\times10^{16}$ to $1\times10^{18}$ cm$^{-3}$. The thickness of the impurity region 15 is set in the range of 0.1 to 2 μm.

The JFET resistance is formed between the body region 5 and the trench-bottom protecting layer 7, but by the formation of this impurity region 15, extension of the depletion layer from the body region 5 to the drift layer 2 is suppressed and the current path widens to enable reduction in the JFET resistance.

<Second Modification>

Figure 23:
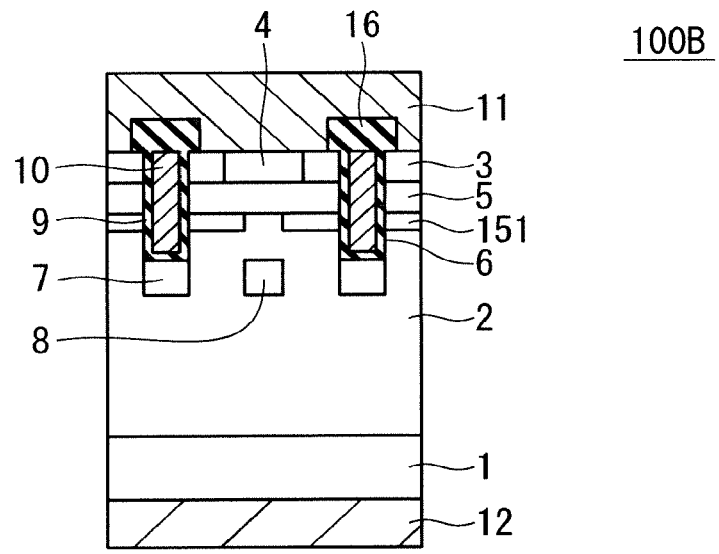
FIG. 23 is a sectional view showing a configuration of one cell of a MOSFET in a second modification of the first embodiment according to the present invention.

FIG. 23 is a sectional view showing a configuration of a SiC-MOSFET 100B according to a second modification of the first embodiment. In FIG. 23, the same components as those of the SiC-MOSFET 100 described with reference to FIG. 1 are denoted by the same reference numerals, and repeated descriptions are omitted.

As shown in FIG. 23, the SiC-MOSFET 100B includes an impurity region 151 provided in the drift layer 2 under the body region 5 so as to contact the bottom surface of the body region 5. The impurity region 151 does not cover the entire bottom surface of the body region 5 and is configured not to cover the central part of the bottom surface of the body region 5. The impurity concentration and the thickness are the same as those of the impurity region 15 of the SiC-MOSFET 100A.

The reason for not providing the impurity region 151 in the central part of the bottom surface of the body region 5 as thus described is that the central part does not become a current path, so that even when the depletion layer expands, the current path does not easily narrow to cause the resistance to hardly increase, and in addition to this, the breakdown voltage can be increased by the depletion layer extending from the p-type body region 5 to the n-type drift layer 2, to suppress the electric field applied to the gate insulating film 9.

<Third Modification>

Figure 24:
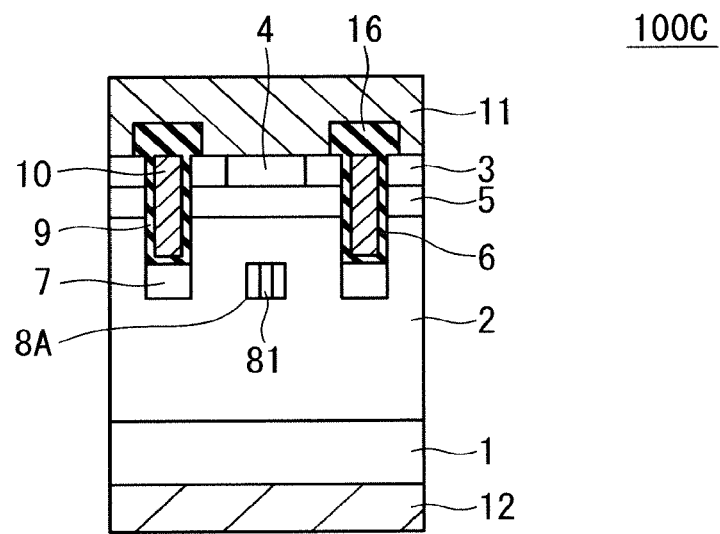
FIG. 24 is a sectional view showing a configuration of one cell of a MOSFET in a third modification of the first embodiment according to the present invention.

FIG. 24 is a sectional view showing a configuration of a SiC-MOSFET 100C according to a third modification of the first embodiment. In FIG. 24, the same components as those of the SiC-MOSFET 100 described with reference to FIG. 1 are denoted by the same reference numerals, and repeated descriptions are omitted.

As shown in FIG. 24, in the SiC-MOSFET 100C, a depletion suppressing layer 8A provided in the drift layer 2 between the adjacent trench-bottom protecting layers 7 is not uniform but nonuniform in impurity concentration, having concentration distribution.

That is, the depletion suppressing layer 8A shown in FIG. 24 has the highest impurity concentration in a central portion 81 in the horizontal direction, and the impurity concentration is lower in the left and right sides of the central portion 81 than in the central portion 81. For obtaining such impurity concentration distribution, ions are implanted obliquely or ions are implanted with a widened dispersion angle, so that an implantation layer with a laterally (horizontally) nonuniform concentration can be formed.

By making the depletion suppressing layer 8A have the impurity concentration distribution with the highest impurity concentration in the central portion 81 as thus described, the extension of the depletion layer horizontally extending from the trench-bottom protecting layer 7 can be reliably suppressed in a part where the depletion layer extends most, to improve the trade-off between the breakdown voltage and the on-resistance. Note that the depletion suppressing layer 8A may have a multilayer structure with different concentrations in the horizontal direction.

<Fourth Modification>

Figure 25:
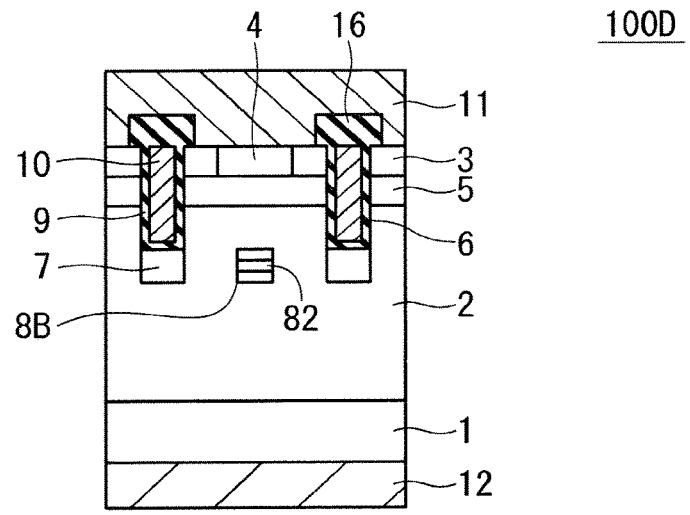
FIG. 25 is a sectional view showing a configuration of one cell of a MOSFET in a fourth modification of the first embodiment according to the present invention.

FIG. 25 is a sectional view showing a configuration of a SiC-MOSFET 100D according to a fourth modification of the first embodiment. In FIG. 25, the same components as those of the SiC-MOSFET 100 described with reference to FIG. 1 are denoted by the same reference numerals, and repeated descriptions are omitted.

As shown in FIG. 25, in the SiC-MOSFET 100D, a depletion suppressing layer 8B provided in the drift layer 2 between the adjacent trench-bottom protecting layers 7 is not uniform but nonuniform in impurity concentration, having concentration distribution.

That is, the depletion suppressing layer 8B shown in FIG. 25 has the highest impurity concentration in a central portion 82 in the vertical direction (a direction vertical to the main surface of the substrate), and the impurity concentration is lower in the upper and lower sides of the central portion 82 than in the central portion 82. For obtaining such impurity concentration distribution, acceleration energy at the time of ion implantation is set so as to be at an implantation peak in the central portion 82, so that an implantation layer with a longitudinally (vertically) nonuniform concentration can be formed.

By making the depletion suppressing layer 8B as an impurity layer having nonuniform impurity concentration distribution as thus described, the extension of the depletion layer horizontally extending from the trench-bottom protecting layer 7 can be reliably suppressed in a part where the depletion layer extends most, and the impurity concentration is lower in a part closer to the bottom of the trench 6, thus enabling reduction in the field intensity applied to the trench 6.

The depletion suppressing layer 8B may have a multilayer structure with different concentrations in the vertical direction. In the depletion suppressing layer 8B, one of the impurity concentrations may be lower than the other on the upper and lower sides of the central portion 82. When at least the impurity concentration in the central portion 82 is sufficiently high, it is possible to suppress the extension of the depletion layer in the depletion suppressing layer 8.

Second Embodiment

Figure 26:
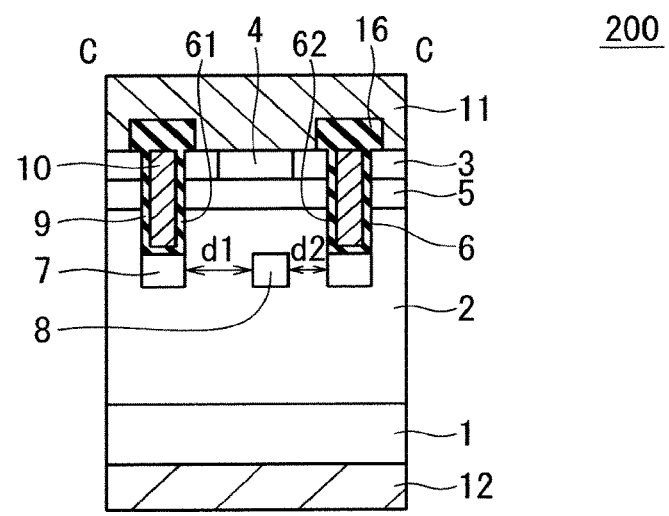
FIG. 26 is a sectional view showing a configuration of one cell of a MOSFET in a second embodiment according to the present invention.

FIG. 26 is a sectional view schematically showing a partial configuration of a SiC-MOSFET 200 formed on the SiC substrate. In FIG. 26, the same components as those of the SiC-MOSFET 100 described with reference to FIG. 1 are denoted by the same reference numerals, and repeated descriptions are omitted.

As shown in FIG. 26, in the SiC-MOSFET 200, the depletion suppressing layer 8 provided in the drift layer 2 between the adjacent trench-bottom protecting layers 7 includes an intermediate point that is horizontally equidistant to the adjacent trench-bottom protecting layer 7, and the depletion suppressing layer 8 is provided at such a position that a distance d1 to a side wall 61 of one of the trenches 6 is different from a distance d2 to a side wall 62 of the other trench 6. That is, the depletion suppressing layer 8 is provided so as to be offset toward one of the trenches 6. Note that the horizontal position of the depletion suppressing layer 8 between the adjacent trench-bottom protecting layers 7 is set by the position of the opening of the resist mask RM1 in the step described with reference to FIG. 8, and can thus be easily shifted by changing the position of the opening of the resist mask RM1.

In this manner, by setting the distance between the side wall of the trench 6 and the depletion suppressing layer 8 in a specific one direction different from the distance in the other direction, in addition to the effect of the first embodiment, it is possible to reduce variations in current during the on-state, depending on the difference in the crystal plane due to an influence of an off-angle of the substrate. This will be described with reference to FIG. 27 which shows the relationship between the side wall of the trench 6 and the crystal plane.

Figure 27:
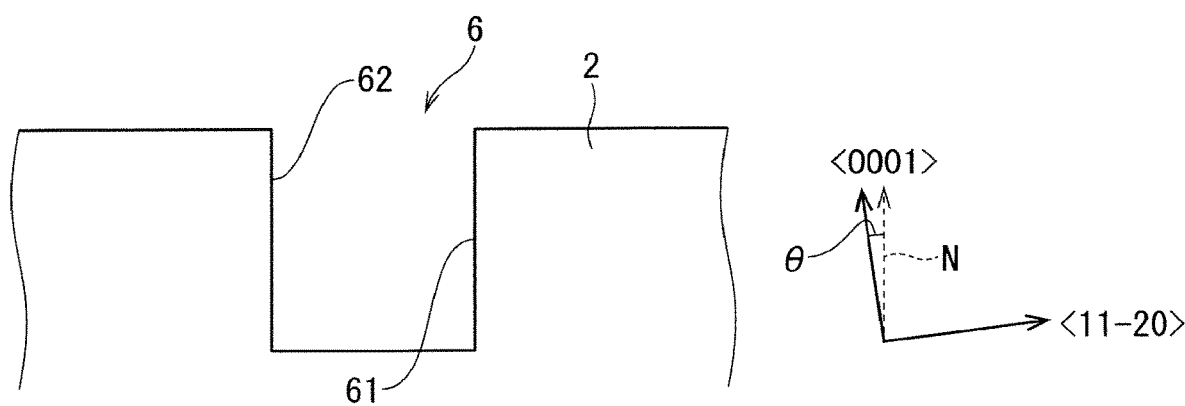
FIG. 27 is a view showing the relationship between a side wall of a trench and a crystal plane.

As shown in FIG. 27, when the SiC substrate 1 is a 4H—SiC substrate, the main surface of the SiC substrate 1 is inclined with a <0001> c axis from a normal direction N to a <11-20> direction by an angle θ. This angle θ is referred to as an off-angle, and due to the influence of the off-angle, the side wall 61 of the trench 6 and the side wall 62 have different plane orientations. More specifically, the side wall 61 of the trench 6 is a surface with a (11-20) plane inclined by the off-angle in a (0001) plane direction, and the side wall 62 of the trench 6 is a surface with the (11-20) plane inclined by the off-angle in a (000-1) plane direction.

In such a configuration, the electron mobility of the channel of the MOSFET formed on each side wall surface is different, and the current density during the on-state is different between the side wall 61 and the side wall 62. When it is assumed here that a side wall made of a crystal plane having a high electron mobility (a crystal plane having a first electron mobility) is the side wall 61, a side wall made of a crystal plane having a low electron mobility (a crystal plane having a second electron mobility) is the side wall 62, by making the distance d1 larger than the distance d2, the width of the depletion layer between the vicinity of the side wall 61 and the depletion suppressing layer 8 becomes larger than the width of the depletion layer between the vicinity of the side wall 62 and the depletion suppressing layer 8, and the current path becomes narrower. That is, the width of the current path due to the extension of the depletion layer changes in accordance with the distance between the side wall of the trench 6 and the depletion suppressing layer 8.

By changing the distance to the depletion suppressing layer 8 in accordance with the plane orientation of the side wall of the trench 6, the current density for each plane orientation of the side wall of the trench 6 can be adjusted to reduce the influence of the variations in current. As a result, the variations in current in the device are reduced, to enable improvement in the reliability of the device. Although it is assumed here that the side wall 61 is the surface inclined by the off-angle in the (0001) plane direction and the distance d1 between the side wall 61 and the depletion suppressing layer 8 is made larger than d2, the present invention is not limited to this, and the distance d2 between the side wall 62 inclined in the (000-1) plane direction and the depletion suppressing layer 8 may be made larger than the distance d1.

Figure 28:
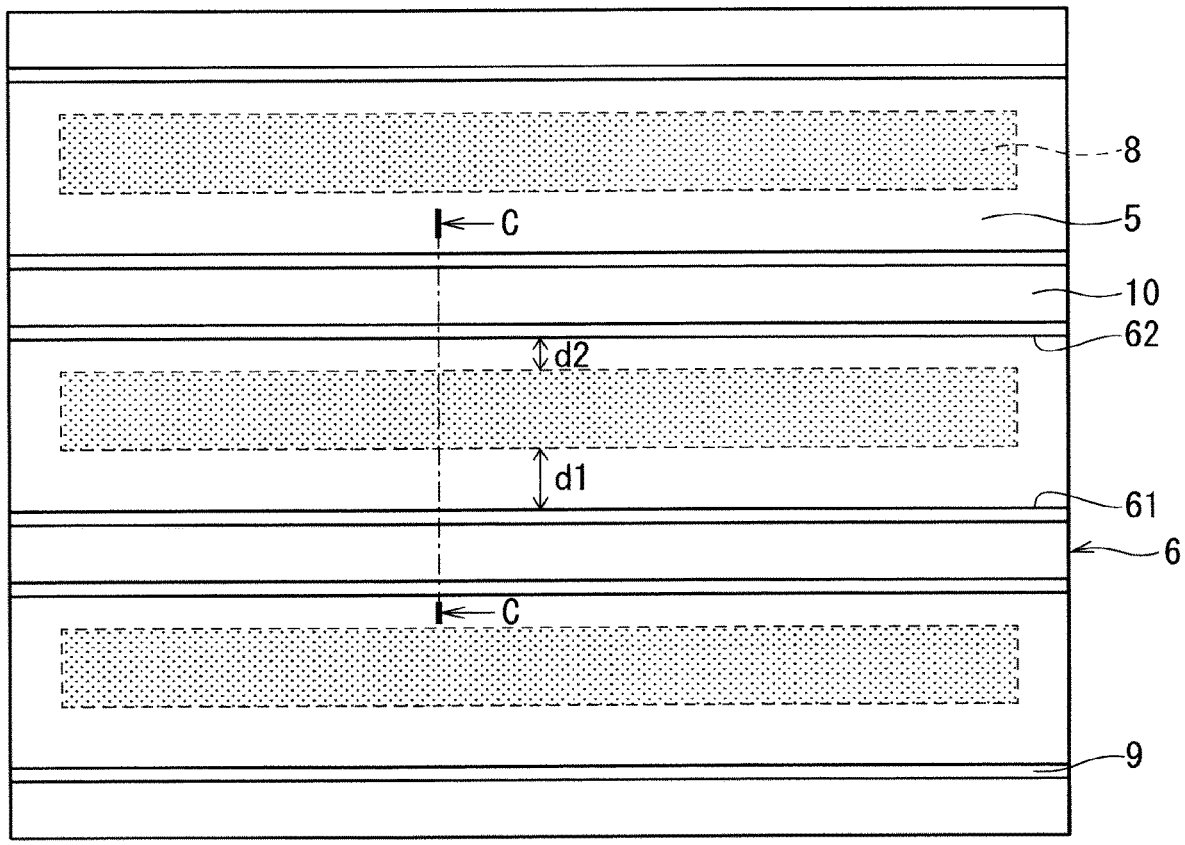
FIG. 28 is a view showing an example of a planar pattern of the cell of the MOSFET in the second embodiment according to the present invention.

FIG. 28 shows a cell of a planar pattern in which the trenches 6 are formed in the stripe shape, and a cross section taken along line C-C of FIG. 28 in the direction of arrows corresponds to the sectional view of FIG. 26. As shown in FIG. 28, the position of the depletion suppressing layer 8 is set such that, out of the two trenches provided in parallel with the depletion suppressing layer 8 interposed therebetween, the distance between the side wall 61 of one trench 6 and the depletion suppressing layer 8 is larger than the distance between the side wall 62 of the other trench 6 and the depletion suppressing layer 8.

Figure 29:
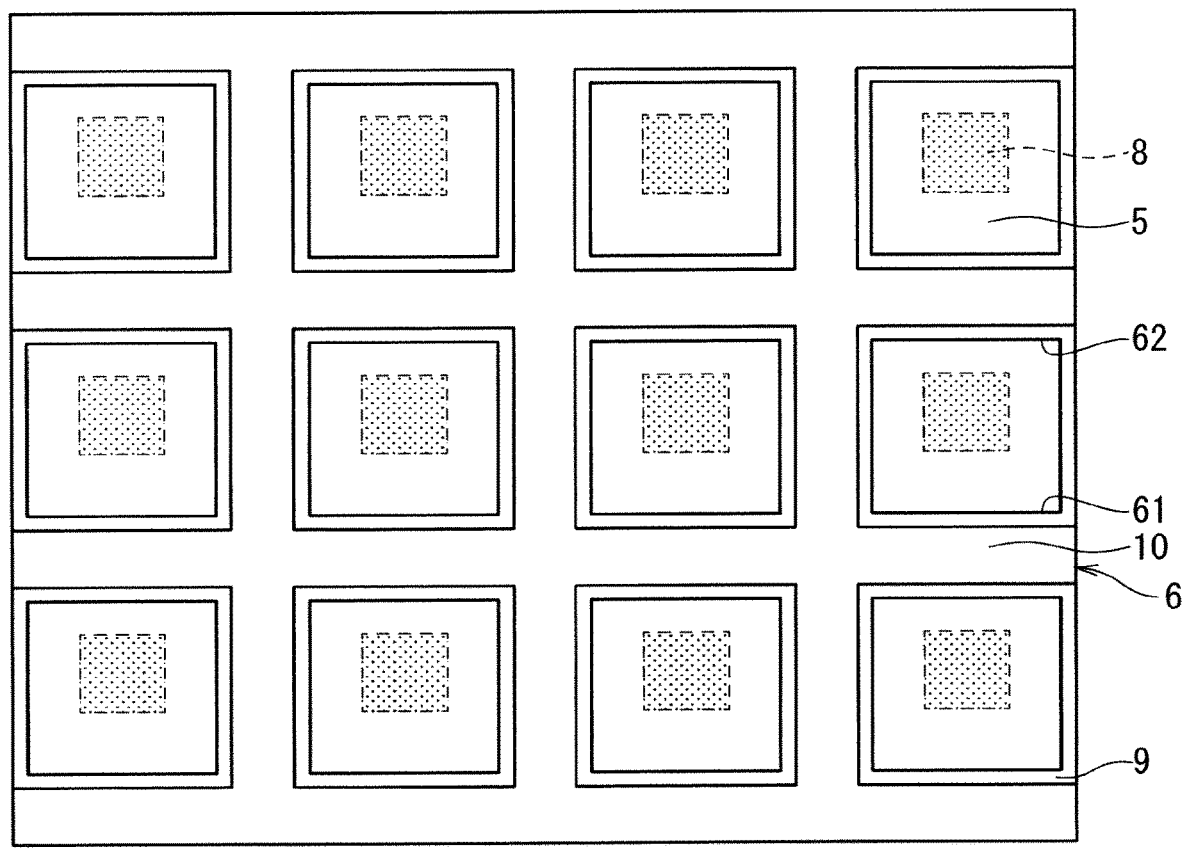
FIG. 29 is a view showing an example of the planar pattern of the cell of the MOSFET in the second embodiment according to the present invention.

FIG. 29 shows a cell having a planar pattern in which the trenches 6 have the lattice shape. As shown in FIG. 29, when the trenches 6 have the lattice shape, the shape in plan view of the cell surrounded by the trenches 6 in the lattice shape is a quadrangle, and the shape in plan view of the depletion suppressing layer 8 is also a quadrangle similar to the cell. In this case, the position of the depletion suppressing layer 8 is set such that, out of the two trenches provided with the depletion suppressing layer 8 interposed therebetween, the distance between the side wall 61 of one trench 6 and the depletion suppressing layer 8 is larger than the distance between the side wall 62 of the other trench 6 and the depletion suppressing layer 8.

In the case of the planar pattern in which the trenches 6 are formed in the lattice shape, the cell is surrounded by four trenches 6, but the plane orientation of the crystal plane differs for each side wall of the trench 6 due to the difference in plane orientation of the substrate crystal, and the electron mobility differs for each side wall surface to cause the current to vary.

Figure 30:
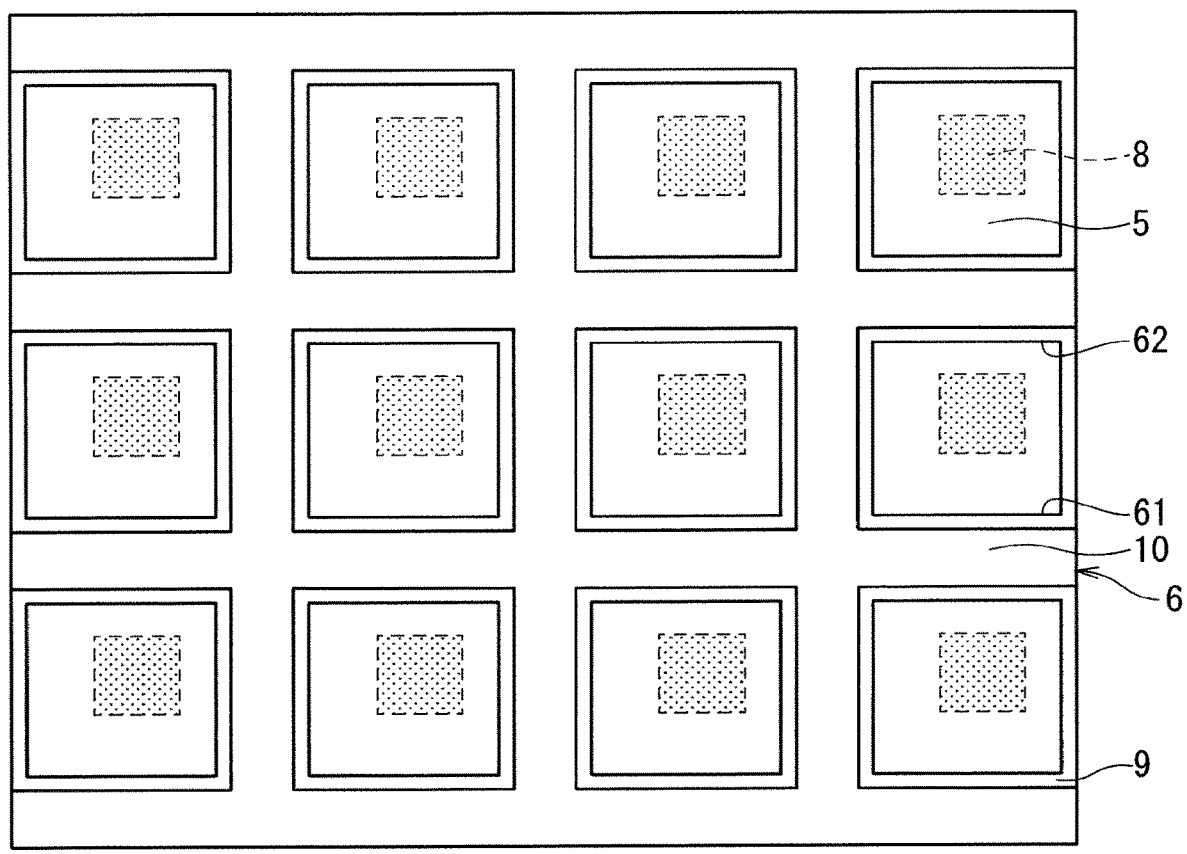
FIG. 30 is a view showing an example of the planar pattern of the cell of the MOSFET in the second embodiment according to the present invention.

Therefore, in order to reduce the variations in current, as shown in FIG. 30, by disposing the depletion suppressing layer 8 at a position close to one corner of the cell, the respective distances between the side wall of the trench 6 and the depletion suppressing layer 8 in two or more different directions may be made different. In the configuration of FIG. 30, the distances between the four side walls of the depletion suppressing layer 8 and the side walls of the four opposed trenches 6 are different from each other. However, also in this case, the position of the depletion suppressing layer 8 must be set so as to include an intermediate point that is horizontally equidistant to the adjacent trench-bottom protecting layer 7. Note that the shape in plan view of the depletion suppressing layer 8 is not limited to the square or the rectangle but may be a polygon or may have each corner with curvature.

Third Embodiment

Figure 31:
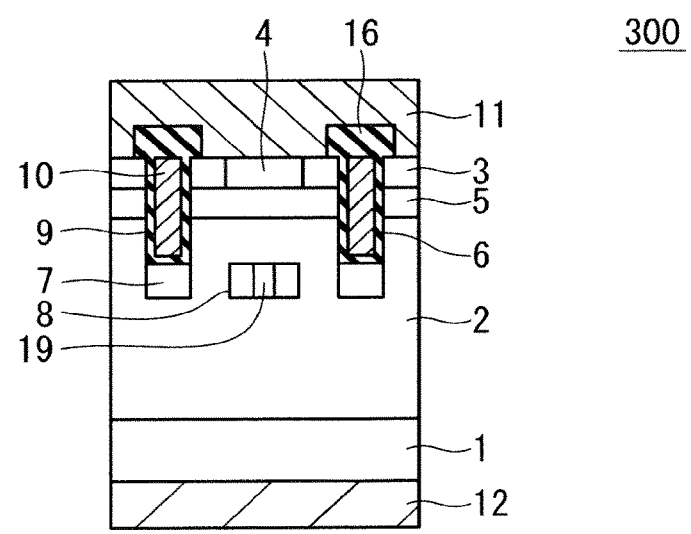
FIG. 31 is a sectional view showing a configuration of one cell of a MOSFET in a third embodiment according to the present invention.

FIG. 31 is a sectional view schematically showing a partial configuration of a SiC-MOSFET 300 formed on the SiC substrate. In FIG. 31, the same components as those of the SiC-MOSFET 100 described with reference to FIG. 1 are denoted by the same reference numerals, and repeated descriptions are omitted.

As shown in FIG. 31, in the SiC-MOSFET 300, it is configured such that the depletion suppressing layer 8 provided in the drift layer 2 between the adjacent trench-bottom protecting layers 7 includes a breakdown-voltage sustaining layer 19 containing p-type impurities in the horizontally central part.

With such a configuration adopted, the breakdown-voltage sustaining layer 19 can be caused to also share the electric field during the off-state applied to the trench-bottom protecting layer 7, and it is possible to reduce the field intensity both at the bottom of the body region 5 and the bottom of the trench 6 and to sustain the breakdown voltage.

That is, when the breakdown-voltage sustaining layer 19 is not provided, the electric field during the off-state is applied to the trench-bottom protecting layer 7. When the area of the trench-bottom protecting layer 7 is large, the concentration of the electric field hardly occurs, but because the area of the trench-bottom protecting layer 7 is defined by the bottom area of the trench 6, the trench-bottom protecting layer 7 is narrow and the concentration of the electric field easily occurs. However, by providing the breakdown-voltage sustaining layer 19 between the trenches 6, the electric field applied only to the trench-bottom protecting layer 7 is also applied to the breakdown-voltage sustaining layer 19, to relax the concentration of the electric field on the bottom of the trench. Providing the breakdown-voltage sustaining layer 19 can also relax the concentration of the electric field on the bottom of the body region 5.

The thickness of the breakdown-voltage sustaining layer 19 may be smaller or larger than that of the depletion suppressing layer 8. When the thickness of the breakdown-voltage sustaining layer 19 is smaller than the depletion suppressing layer 8, it may be configured such that the depletion suppressing layer 8 covers the upper or lower side of the breakdown-voltage sustaining layer 19, thereby eliminating a level difference from the depletion suppressing layer 8. Further, it may be configured such that the breakdown-voltage sustaining layer 19 is surrounded by the depletion suppressing layer 8.

When the thickness of the breakdown-voltage sustaining layer 19 is equal to or larger than the thickness of the depletion suppressing layer 8, the thickness of the breakdown-voltage sustaining layer 19 may be a thickness connected to the upper body region 5.

The width of the breakdown-voltage sustaining layer 19 is preferably equal to the width of the trench-bottom protecting layer 7 or smaller than the width of the trench-bottom protecting layer 7.

After formation of the depletion suppressing layer 8 by using the resist mask RM1 in the step described with reference to FIG. 8, the breakdown-voltage sustaining layer 19 can be formed by using a resist mask with an opening for forming the breakdown-voltage sustaining layer 19 to perform ion implantation of p-type impurities into the central part of the depletion suppressing layer 8, and its impurity concentration is set in the range of $1\times10^{16}$ to $1\times10^{19}$ cm$^{-3}$.

<Modification>

Figure 32:
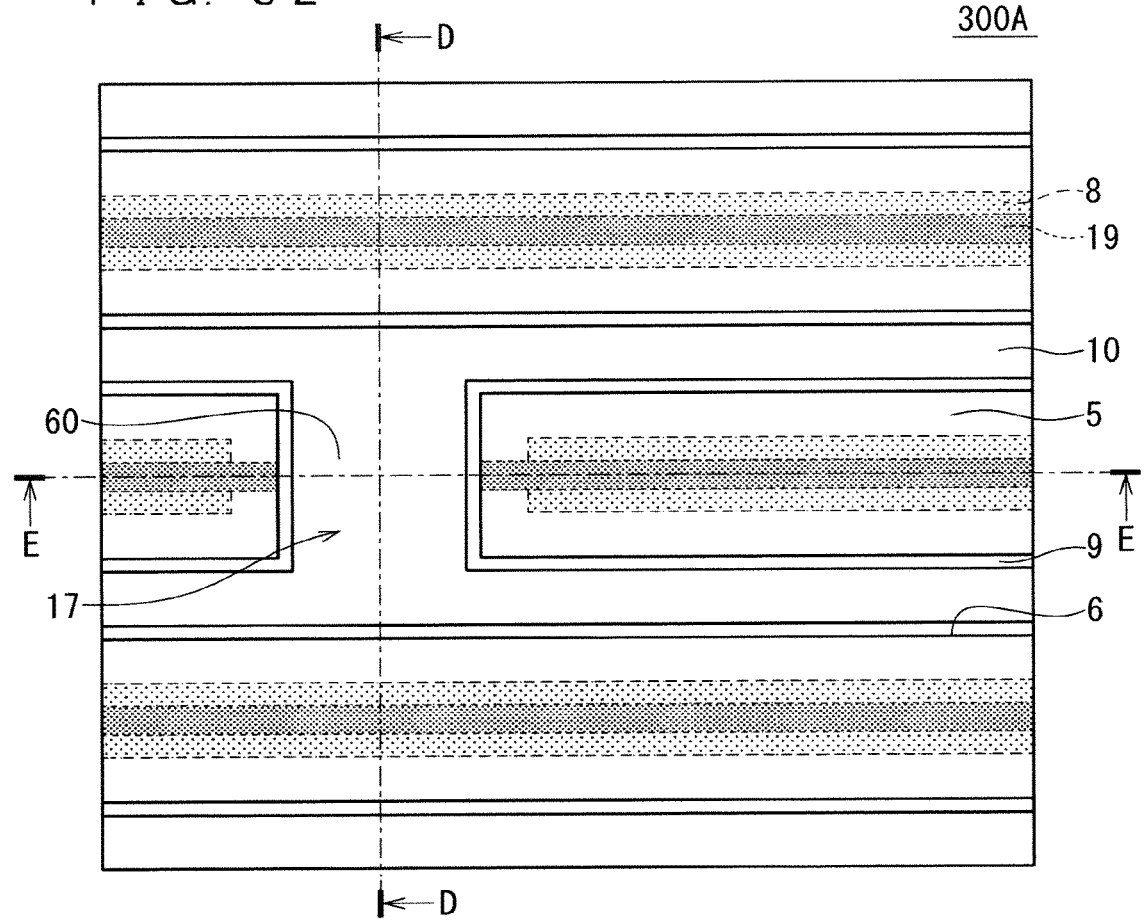
FIG. 32 is a view showing an example of a planar pattern of a cell of a MOSFET in a modification of the third embodiment according to the present invention.

Next, a configuration of a SiC-MOSFET 300A according to a modification of the third embodiment will be described with reference to FIG. 32. FIG. 32 is a view showing a planar pattern of the cell of the SiC-MOSFET 300A, illustrating such a configuration that in the planar pattern in which the trenches 6 are formed in the stripe shape, the quadrangular depletion suppressing layers 8 are formed in the stripe shape along the extending direction of the trenches 6. The shape in plan view is configured such that, out of a plurality of body regions 5 defined in the stripe shape by the trenches 6, one body region 5 is divided by the trench 60 in the middle, which is a similar configuration to that of the potential fixing portion 17 described with reference to FIG. 18.

As shown in FIG. 32, the breakdown-voltage sustaining layers 19 in the stripe shape are each provided along the depletion suppressing layer 8 in the central portion in the width direction of the stripe-shaped depletion suppressing layer 8, and the depletion suppressing layers 8 and the breakdown-voltage sustaining layer 19 extend without being divided in parts other than a part in which the potential fixing portion 17 is provided.

Meanwhile, in the part where the body region 5 is divided by the trench 60 in the middle, it is configured such that the depletion suppressing layer 8 is divided before the trench 60, but the breakdown-voltage sustaining layer 19 extends to the lower part of the side surface of the trench 60, and is connected to the side surface of the trench-bottom protecting layer 7 provided on the bottom of the trench 60. In other words, it is configured such that the trench-bottom protecting layer 7 provided at the bottom of the trench 60, which is provided so as to extend between the cells, is connected to the breakdown-voltage sustaining layer 19.

With such a configuration adopted, the breakdown-voltage sustaining layer 19 is electrically connected to the source electrode 11 via the trench-bottom protecting layer 7, and the breakdown-voltage sustaining layer 19 has the same potential as that of the trench-bottom protecting layer 7, whereby, when the MOSFET is off, the electric field can be received more evenly in the vicinity of the bottom of the trench, and the concentration of the electric field can be relaxed to sustain the breakdown voltage. Further, the breakdown-voltage sustaining layer 19 is electrically connected to the source electrode 11 via the trench-bottom protecting layer 7 to increase a response speed of charges, and hence reduction in switching loss due to improvement in switching speed can be expected.

Figure 33:
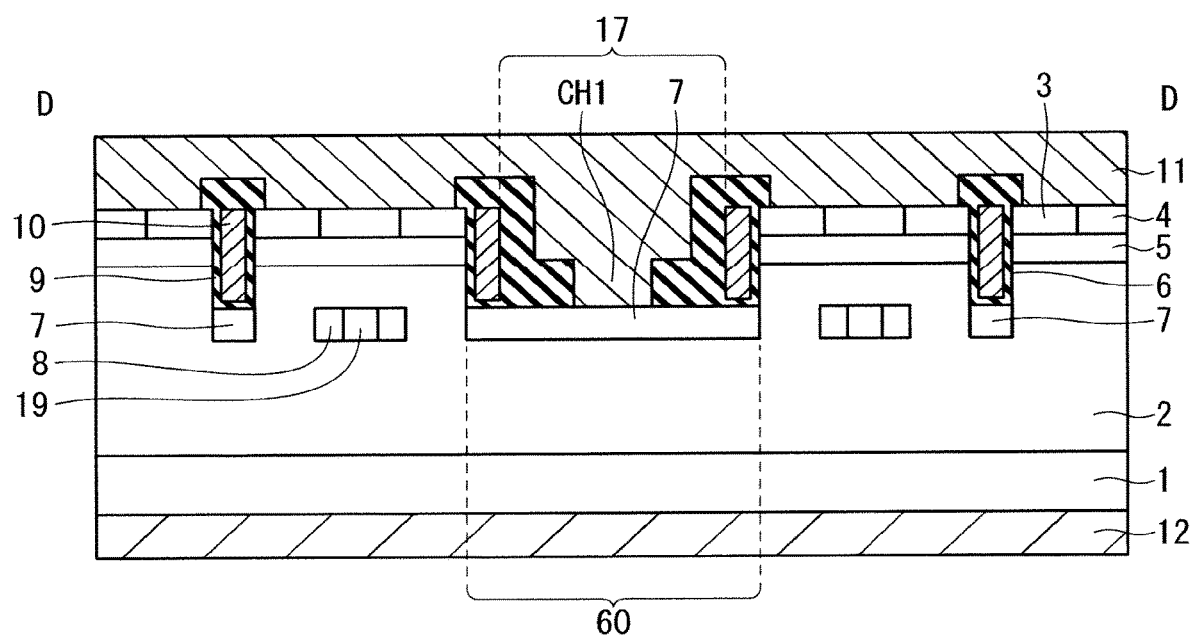
FIG. 33 is a sectional view showing a configuration of a potential fixing portion of a trench-bottom protecting layer and a source electrode.
Figure 34:
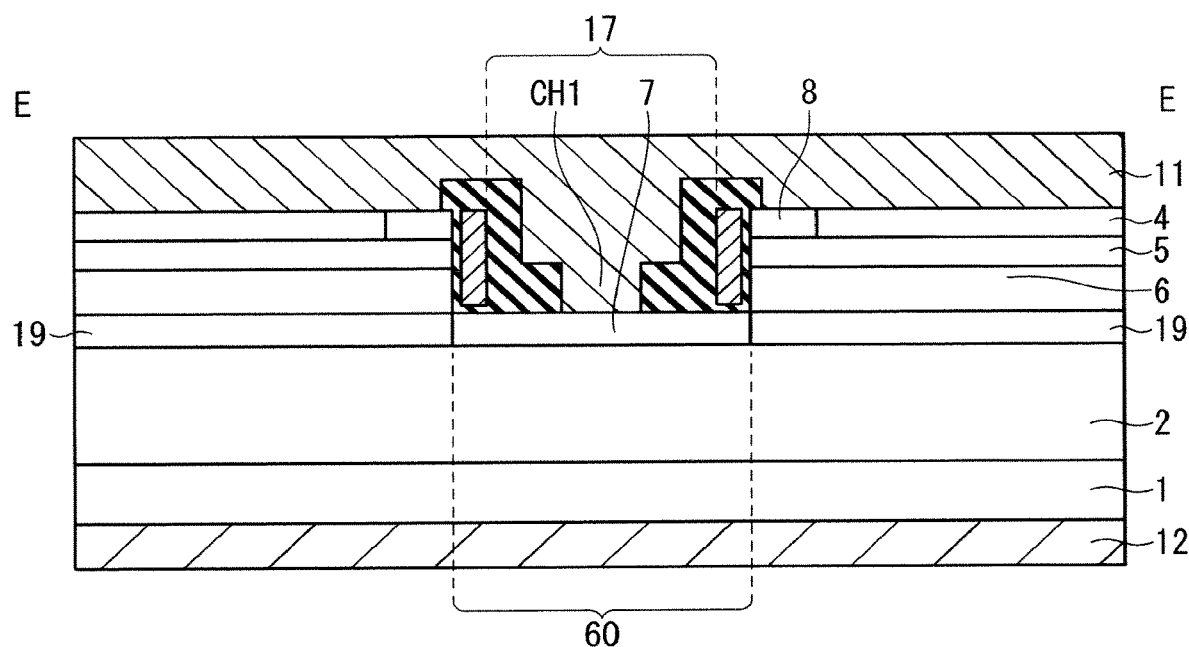
FIG. 34 is a sectional view showing the configuration of the potential fixing portion of the trench-bottom protecting layer and the source electrode.

FIG. 33 is a sectional view showing a cross-sectional configuration taken along line D-D in FIG. 32, and FIG. 34 is a sectional view showing a cross-sectional configuration taken along line E-E in FIG. 32. As shown in FIG. 33, it is configured such that the breakdown-voltage sustaining layer 19 is provided in the horizontally central part of each of the depletion suppressing layers 8 in the stripe shape.

The thickness of the breakdown-voltage sustaining layer 19 may be smaller or thicker than that of the depletion suppressing layer 8 but is desirably made approximately equal to or smaller than the thickness of the trench-bottom protecting layer 7.

Note that the expression "A and B are electrically connected" used in the above description means that a current flows bidirectionally between the component A and the component B. In addition, the same thickness and the same depth are not limited to a case where they perfectly match but include a case where they are different in the range of −20% to +20%.

Other Application Examples

In the first to third embodiments described above, the examples have been shown where the present invention is applied to the MOSFET with the drift layer 2 and the SiC substrate 1 (including the buffer layer) having the same conductivity type, but the present invention is also applicable to an IGBT with the drift layer 2 and the SiC substrate 1 having different conductivity types.

For example, with respect to the configuration shown in FIG. 1, a configuration in which the SiC substrate 1 is a p-type with respect to the n-type drift layer 2 is a configuration of the IGBT. In that case, the source region 3 and the source electrode 11 of the MOSFET correspond to an emitter region and an emitter electrode of the IGBT, respectively, and the drain electrode 12 of the MOSFET corresponds to a collector electrode.

The present invention is also applicable to a free-standing substrate made up only of the drift layer 2 (epitaxial growth layer) by removing the SiC substrate 1 mechanically or chemically or by other methods. Note that the free-standing substrate made up only of the epitaxial growth layer can also be referred to as a "SiC substrate". A MOSFET is obtained by forming a source region, a source electrode, and the like on one main surface of the free-standing substrate and a drain electrode on the other main surface, while an IGBT is obtained by forming an emitter region, an emitter electrode, and the like on one main surface of the free-standing substrate and a collector region and a collector electrode on the other main surface.

In the first to third embodiments, the examples have been shown where the present invention is applied to the silicon carbide semiconductor, but the present invention is also applicable to other wide band gap semiconductors such as gallium nitride (GaN), diamond (C), and the like. Even when a wide band gap semiconductor containing silicon carbide is used as the semiconductor material, the electric field at the bottom of the trench can be relaxed and the reliability of the gate insulating film and the breakdown voltage can be improved.

Fourth Embodiment

In the present embodiment, the semiconductor devices according to the first to third embodiments described above are applied to a power conversion device. Although the present invention is not limited to a specific power conversion device, hereinafter, a case where the present invention is applied to a three-phase inverter will be described as a fourth embodiment.

Figure 35:
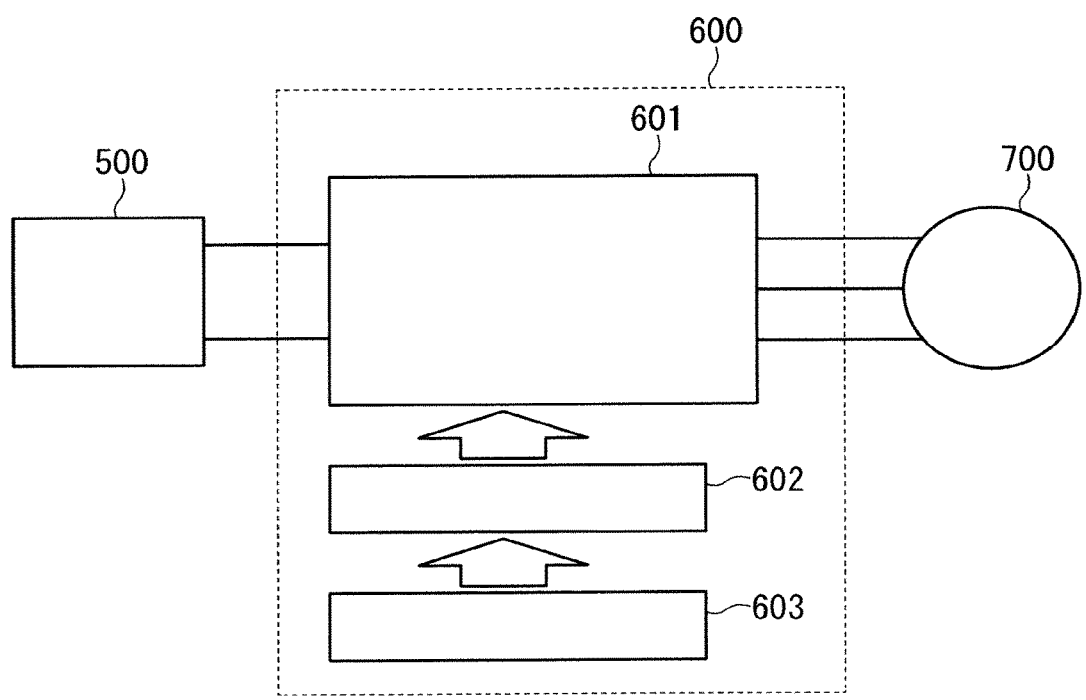
FIG. 35 is a block diagram showing a configuration of a power conversion system in a fifth embodiment according to the present invention.

FIG. 35 is a block diagram showing a configuration of a power conversion system to which the power conversion device according to the present embodiment has been applied.

The power conversion system shown in FIG. 35 includes a power supply 500, a power conversion device 600, and a load 700. The power supply 500 is a DC power supply and supplies DC power to the power conversion device 600. The power supply 500 can be constituted by various types and can, for example, be constituted by a DC system, a solar battery, or a storage battery, or may be constituted by a rectifier circuit or an AC/DC converter connected to an AC system. Further, the power supply 500 may be constituted by a DC/DC converter that converts DC power output from the DC system to predetermined electric power.

The power conversion device 600 is a three-phase inverter connected between the power supply 500 and the load 700, converts the DC power supplied from the power supply 500 into AC power, and supplies the AC power to the load 700. As shown in FIG. 35, the power conversion device 600 includes a main conversion circuit 601 for converting DC power into AC power and outputting the AC power, a drive circuit 602 for outputting a drive signal for driving each switching element of the main conversion circuit 601, and a control circuit 603 for outputting a control signal for controlling the drive circuit 602 to the drive circuit 602.

The load 700 is a three-phase motor driven by AC power supplied from the power conversion device 600. Note that the load 700 is not limited to a specific application, but is an electric motor mounted in various electric devices, and is used as, for example, a hybrid vehicle, an electric vehicle, a railroad vehicle, an elevator, or an electric motor for air conditioning equipment.

Hereinafter, details of a power conversion device 600 will be described. The main conversion circuit 601 includes a switching element and a freewheeling diode (not shown), and by switching of the switching element, the main conversion circuit 601 converts the DC power supplied from the power supply 500 into AC power and supplies the AC power to the load 700. Although there are various specific circuit configurations of the main conversion circuit 601, the main conversion circuit 601 according to the present embodiment is a two-level three-phase full bridge circuit and can be made up of six switching elements and six freewheeling diodes that are anti-parallel to the respective switching elements. For each switching element of the main conversion circuit 601, the semiconductor device according to any one of the first to third embodiments described above is applied. The six switching elements are connected in series for every two switching elements to form upper and lower arms, and each upper and lower arm constitutes each phase (U-phase, V-phase, W-phase) of the full bridge circuit. The output terminals of the upper and lower arms, namely, three output terminals of the main conversion circuit 601 are connected to the load 700.

The drive circuit 602 generates a drive signal for driving the switching element of the main conversion circuit 601 and supplies the drive signal to a control electrode of the switching element of the main conversion circuit 601. Specifically, in accordance with a control signal from a control circuit 603 described later, a drive signal for bringing the switching element into the on-state and a drive signal for bringing the switching element into the off-state are output to the control electrode of each switching element. When the switching element is held in the on-state, the drive signal is a voltage signal (on-signal) equal to or higher than a threshold voltage of the switching element, and when the switching element is held in the off-state, the drive signal is a voltage signal (off-signal) equal to or lower than the threshold voltage of the switching element.

The control circuit 603 controls the switching element of the main conversion circuit 601 so that desired power is supplied to the load 700. Specifically, a time (on-time) at which each switching element of the main conversion circuit 601 is to be in the on-state is calculated based on electric power to be supplied to the load 700. For example, it is possible to control the main conversion circuit 601 by PWM control that modulates the on-time of the switching element in accordance with a voltage to be output. Then, a control command (control signal) is output to the drive circuit 602 such that an on-signal is output to the switching element to come into the on-state at each time point, and that an off-signal is output to the switching element to come into the off-state at each time point. In accordance with this control signal, the drive circuit 602 outputs an on-signal or an off-signal as a drive signal to the control electrode of each switching element.

In the power conversion device according to the present embodiment, the semiconductor device according to any of the first to third embodiments is applied as the switching element of the main conversion circuit 601, so that it is possible to improve the trade-off relationship between relaxation of concentration of the electric field on the bottom of the trench and reduction in on-resistance In addition, the breakdown voltage can be sustained without increasing the field intensity of the bottom of the third semiconductor region being a body region.

In the present embodiment, the example has been described where the present invention is applied to the two-level three-phase inverter, but the present invention is not limited to this and can be applied to various power conversion devices. Although the power conversion device is the two-level power conversion device in the present embodiment, it may be a three-level or multi-level power conversion device, or when electric power is to be supplied to a single-phase load, the present invention may be applied to a single-phase inverter. When electric power is to be supplied to a DC load or the like, the present invention is also applicable to a DC/DC converter or an AC/DC converter.

Further, the power conversion device to which the present invention has been applied is not limited to the case where the load described above is the electric motor, but may be used as, for example, a power supply device of an electric discharge machine, a laser processing machine, an induction heating cooker, or a non-contact power supply system, and can also be used as a power conditioner of a photovoltaic power generation system, a power storage system, or the like.

While the present invention has been described in detail, the above description is in all aspects illustrative and the present invention is not limited thereto. It is understood that innumerable modifications not illustrated can be envisaged without departing from the scope of the present invention.

Note that in the present invention, it is possible to freely combine the embodiments within the scope of the present invention, and to deform or omit each embodiment as appropriate.

The invention claimed is:

1. A semiconductor device comprising:
   a semiconductor substrate;
   a semiconductor layer of a first conductivity type disposed on a first main surface of the semiconductor substrate;
   a first semiconductor region of the first conductivity type selectively provided in an upper layer portion of the semiconductor layer;
   a second semiconductor region of a second conductivity type provided in the upper layer portion of the semiconductor layer while contacting the first semiconductor region;
   a third semiconductor region of the second conductivity type provided contacting a bottom surface of the first and second semiconductor regions;
   trenches each penetrating the first and third semiconductor regions in a thickness direction and reaching an inside of the semiconductor layer;
   a gate insulating film covering an inner surface of each of the trenches;
   a gate electrode embedded in each of the trenches covered with the gate insulating film;
   a trench-bottom protecting layer of the second conductivity type provided so as to contact a bottom of each of the trenches;
   a depletion suppressing layer of the first conductivity type provided between adjacent trench-bottom protecting layers;
   an interlayer insulating film covering tops of the trenches and the first semiconductor region around the trenches and having a contact hole above the first and second semiconductor regions;
   a first main electrode covering the interlayer insulating film and embedded in the contact hole; and
   a second main electrode disposed on a second main surface of the semiconductor substrate,
   wherein the depletion suppressing layer includes an intermediate point that is horizontally equidistant to the adjacent trench-bottom protecting layers, the depletion suppressing layer is formed in such a size as to contact none of the third semiconductor region, the trenches, and the trench-bottom protecting layers,
the depletion suppressing layer is provided so as to be located at the same depth and have the same thickness as the trench-bottom protecting layer, and
an impurity concentration of the depletion suppressing layer is set higher than an impurity concentration of the semiconductor layer.

2. The semiconductor device according to claim 1, wherein the trench-bottom protecting layer is electrically connected to the first main electrode.

3. The semiconductor device according to claim 1, wherein the depletion suppressing layer includes a breakdown-voltage sustaining layer of the second conductivity type.

4. The semiconductor device according to claim 3, wherein the breakdown-voltage sustaining layer is connected to the trench-bottom protecting layer.

5. The semiconductor device according to claim 3, wherein the breakdown-voltage sustaining layer is provided in the horizontally central portion of the depletion suppressing layer.

6. A power conversion device comprising:
a main conversion circuit that has the semiconductor device according to claim 1 and converts input electric power to output the converted electric power;
a drive circuit that outputs to the semiconductor device a drive signal for driving the semiconductor device; and
a control circuit that outputs to the drive circuit a control signal for controlling the drive circuit.

7. A semiconductor device comprising:
a semiconductor substrate;
a semiconductor layer of a first conductivity type disposed on a first main surface of the semiconductor substrate;
a first semiconductor region of the first conductivity type selectively provided in an upper layer portion of the semiconductor layer;
a second semiconductor region of a second conductivity type provided in the upper layer portion of the semiconductor layer while contacting the first semiconductor region;
a third semiconductor region of the second conductivity type provided contacting a bottom surface of the first and second semiconductor regions;
an impurity region of the first conductivity type provided so as to contact a bottom surface of the third semiconductor region;
trenches each penetrating the first and third semiconductor regions in a thickness direction and reaching an inside of the semiconductor layer;
a gate insulating film covering an inner surface of each of the trenches;
a gate electrode embedded in each of the trenches covered with the gate insulating film;
a trench-bottom protecting layer of the second conductivity type provided so as to contact a bottom of each of the trenches;
a depletion suppressing layer of the first conductivity type provided between adjacent trench-bottom protecting layers;
an interlayer insulating film covering tops of the trenches and the first semiconductor region around the trenches and having a contact hole above the first and second semiconductor regions;
a first main electrode covering the interlayer insulating film and embedded in the contact hole; and
a second main electrode disposed on a second main surface of the semiconductor substrate,
wherein the depletion suppressing layer includes an intermediate point that is horizontally equidistant to the adjacent trench-bottom protecting layers,
the depletion suppressing layer is formed in such a size as to contact none of the third semiconductor region, the trenches, and the trench-bottom protecting layers,
an impurity concentration of the depletion suppressing layer is set higher than an impurity concentration of the semiconductor layer, and
the impurity region is provided at a position apart from the depletion suppressing layer.

8. The semiconductor device according to claim 7, wherein the impurity region is provided in a region excluding a horizontally central part out of the bottom surface of the third semiconductor region between the trench-bottom protecting layers.

9. The semiconductor device according to claim 7, wherein the trench-bottom protecting layer is electrically connected to the first main electrode.

10. The semiconductor device according to claim 7, wherein the depletion suppressing layer includes a breakdown-voltage sustaining layer of the second conductivity type.

11. The semiconductor device according to claim 10, wherein the breakdown-voltage sustaining layer is connected to the trench-bottom protecting layer.

12. The semiconductor device according to claim 10, wherein the breakdown-voltage sustaining layer is provided in the horizontally central portion of the depletion suppressing layer.

13. A power conversion device comprising:
a main conversion circuit that has the semiconductor device according to claim 7 and converts input electric power to output the converted electric power;
a drive circuit that outputs to the semiconductor device a drive signal for driving the semiconductor device; and
a control circuit that outputs to the drive circuit a control signal for controlling the drive circuit.

14. A semiconductor device comprising:
a semiconductor substrate;
a semiconductor layer of a first conductivity type disposed on a first main surface of the semiconductor substrate;
a first semiconductor region of the first conductivity type selectively provided in an upper layer portion of the semiconductor layer;
a second semiconductor region of a second conductivity type provided in the upper layer portion of the semiconductor layer while contacting the first semiconductor region;
a third semiconductor region of the second conductivity type provided contacting a bottom surface of the first and second semiconductor regions;
trenches each penetrating the first and third semiconductor regions in a thickness direction and reaching an inside of the semiconductor layer;
a gate insulating film covering an inner surface of each of the trenches;
a gate electrode embedded in each of the trenches covered with the gate insulating film;
a trench-bottom protecting layer of the second conductivity type provided so as to contact a bottom of each of the trenches;
a depletion suppressing layer of the first conductivity type provided between adjacent trench-bottom protecting layers;

an interlayer insulating film covering tops of the trenches and the first semiconductor region around the trenches and having a contact hole above the first and second semiconductor regions;

a first main electrode covering the interlayer insulating film and embedded in the contact hole; and a second main electrode disposed on a second main surface of the semiconductor substrate, wherein the depletion suppressing layer includes an intermediate point that is horizontally equidistant to the adjacent trench-bottom protecting layers, the depletion suppressing layer is formed in such a size as to contact none of the third semiconductor region, the trenches, and the trench-bottom protecting layers, a horizontal position of the depletion suppressing layer is set such that a horizontal distance to a side wall of the trench varies in accordance with a plane orientation of a crystal plane of the side wall of the trench, and an impurity concentration of the depletion suppressing layer is set higher than an impurity concentration of the semiconductor layer.

15. The semiconductor device according to claim 14, wherein a position of the depletion suppressing layer is set such that a horizontal distance to a first side wall made up of a crystal plane having a first electron mobility is larger than a horizontal distance to a second side wall made up of a crystal plane having a second electron mobility which is lower than the first electron mobility.

16. The semiconductor device according to claim 14, wherein the depletion suppressing layer includes a breakdown-voltage sustaining layer of the second conductivity type.

17. The semiconductor device according to claim 16, wherein the breakdown-voltage sustaining layer is connected to the trench-bottom protecting layer.

18. The semiconductor device according to claim 16, wherein the breakdown-voltage sustaining layer is provided in the horizontally central portion of the depletion suppressing layer.

19. A power conversion device comprising:

a main conversion circuit that has the semiconductor device according to claim 14 and converts input electric power to output the converted electric power;

a drive circuit that outputs to the semiconductor device a drive signal for driving the semiconductor device; and a control circuit that outputs to the drive circuit a control signal for controlling the drive circuit.

\* \* \* \* \*